United States Patent
Jang et al.

(10) Patent No.: US 11,095,397 B2
(45) Date of Patent: Aug. 17, 2021

(54) APPARATUS AND METHOD FOR ENCODING AND DECODING USING POLAR CODE IN WIRELESS COMMUNICATION SYSTEM

(71) Applicant: Samsung Electronics Co., Ltd., Suwon-si (KR)

(72) Inventors: Min Jang, Suwon-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 16/370,059

(22) Filed: Mar. 29, 2019

(65) Prior Publication Data

US 2019/0305887 A1 Oct. 3, 2019

(30) Foreign Application Priority Data

Mar. 29, 2018 (KR) .................. 10-2018-0036694

(51) Int. Cl.
*H04L 1/00* (2006.01)
*H04J 13/00* (2011.01)
(Continued)

(52) U.S. Cl.
CPC ........ *H04L 1/0063* (2013.01); *H03M 13/098* (2013.01); *H03M 13/13* (2013.01);
(Continued)

(58) Field of Classification Search
CPC .................................................. H04L 1/0063
See application file for complete search history.

(56) References Cited

U.S. PATENT DOCUMENTS

2017/0257186 A1    9/2017 Ge et al.
2018/0076922 A1*   3/2018 Zhang .................. H03M 13/611
(Continued)

FOREIGN PATENT DOCUMENTS

WO    2018/031715 A1    2/2018

OTHER PUBLICATIONS

E. Arikan, "Channel Polarization a method for constructing capacity-achieving codes for symmetric binary-input memoryless channels," IEEE Trans. Information Theory, vol. 55, No. 7, pp. 3051-3073, Jul. 2009.

(Continued)

*Primary Examiner* — Jason E Mattis
(74) *Attorney, Agent, or Firm* — Jefferson IP Law, LLP

(57) ABSTRACT

A pre-5$^{th}$ generation (5G) or 5G communication system supports higher data rates beyond 4$^{th}$-generation (4G) communication system such as long term evolution (LTE) is provided. A method for operating a first device in a wireless communication system includes generating a first bit sequence, generating a second bit sequence including at least one of the first bit sequence, at least one cyclic redundancy check (CRC) bit, at least one frozen bit, or at least one parity check (PC) bit, generating a transmission bit sequence by performing a polar encoding and a rate matching for the second bit sequence, and transmitting, to a second device, the transmission bit sequence. A length of the transmission bit sequence is equal to or greater than a sum of a length of the first bit sequence, a number of the at least one CRC bit and a number of the at least one PC bit.

17 Claims, 19 Drawing Sheets

(51) Int. Cl.
*H03M 13/13* (2006.01)
*H03M 13/09* (2006.01)
*H03M 13/27* (2006.01)

(52) U.S. Cl.
CPC ..... *H03M 13/2792* (2013.01); *H04J 13/0025* (2013.01); *H04L 1/0013* (2013.01); *H04L 1/0071* (2013.01)

(56) References Cited

U.S. PATENT DOCUMENTS

| | | | |
|---|---|---|---|
| 2018/0076929 | A1 | 3/2018 | Zhang et al. |
| 2018/0278272 | A1* | 9/2018 | Li ......................... H03M 13/09 |
| 2019/0319745 | A1* | 10/2019 | Pan ....................... H04L 1/0057 |
| 2020/0007161 | A1* | 1/2020 | Dikarev ................ H03M 13/13 |
| 2020/0021392 | A1* | 1/2020 | Xu ......................... H04L 1/0041 |
| 2020/0099471 | A1* | 3/2020 | Ye ..................... H03M 13/6362 |

OTHER PUBLICATIONS

I. Tal and A. Vardy, "List decoding of polar codes," IEEE Trans. Inf. Theory, vol. 61, No. 5, pp. 2213-2226, May 2015.
K. Niu and K. Chen, "Stack decoding of polar codes," Electronics Letters, vol. 48, No. 12, pp. 695-697, Jun. 7, 2012.
P. Trifonov and V. Miloslayskaya, "Polar codes with dynamic frozen symbols and their decoding by directed search," in Proc. IEEE Information Theory Workshop (ITW), Sep. 2013, pp. 1-5.
T. Wang, D. Qu, and T. Jiang, "Parity-check-concatenated polar codes," IEEE Commun. Lett., vol. 20, No. 12. pp. 2342-2345, Dec. 2016.
3GPP, NR multiplexing and channel coding (Release 15), TSG RAN TS 38.212 v15.0.0, Dec. 2017.
Samsung, "Necessity of Channel Interleaver for Downlink", 3GPP TSG RAN WG1 Meeting NR#3, R1-1716030, Nagoya, Japan, Sep. 18-21, 2017.
Samsung, "Polar Code Construction for Short UCI", 3GPP TSG RAN WG1 #90bis, R1-1717689, Prague, Czech Republic, Oct. 9-13, 2017.
Samsung, "Remaining Issues on Polar Code Sizes", 3GPP TSG RAN WG1 Ad-hoc Meeting, R1-1800747, Vancouver, Canada, Jan. 22-26, 2017.
International Search Report dated Jul. 9, 2019, issued in International Patent Application No. PCT/KR2019/003739.
International Written Opinion dated Jul. 9, 2019, issued in International Patent Application No. PCT/KR2019/003739.
Extended European Search Report dated Apr. 26, 2021, issued in a counterpart European Application No. 19777067.0-1210/3776951.
SAMSUNG: Companson of CA Polar Codes and PC-CA Polar Codes, 3GPP Draft; R1-1708049 Comparison of CA Polar Codes and PC-CA Polar Codes_V2, 3RD Generation Partnership Project (3GPP), Mobile Competence Centre ; 650, Route Des Lucioles ; F-06921 Sophia-Antipolis vol. RAN WGI, No. XP051273245, May 14, 2017, Hangzhou, China Retrieved from the Internet: URL:http://www.3gpp.org/ftp/Meeti ngs_3GPP.
SAMSUNG: Repetition for Polar Codes, 3GPP Draft; R1-1705423 Repetition for Polar Codes_Final, 3rd Generation Partnership Project (3GPP), Mobile Competence Centre ; 650, Route Des Lucioles F-06921 Sophia-Antipolis Cedex; France, vol. RAN WGI, No. XP051251925, Mar. 25, 2017, Spokane, Washington, USA Retrieved from the Internet: URL:http://www.3gpp.org/ftp/tsg_ran/WGI RL.
Huawei et al.: Polar code design, 3GPP Draft; RI-1706965 Polar Code Design, 3RD Generation Partnership Project (3GPP), Mobile Competence Centre ; 650, Route Des Lucioles ; F-06921 Sophia-Antipolis Cedex; France, vol. RAN WGI, No. XP051272195; May 14, 2017, Hangzhou, China Retrieved from the Internet: URL:http://www.3gpp.org/ftp/Meetings_3GPP SYNC/RANI/Docs/.
NTT DOCOMO: Discussion on Polar codes design, 3GPP Draft' R1-1700867/\Discussion_Polar_Design, 3RD Generation Partnership Project (3GPP), Mobile Competence Centre ; 650, Route Des-Ucioles ; F-06921 Sophia-Antipolis Cedex; France, vol. RAN WGI, No. XP051208384, Jan. 16, 2017, Spokane, USA Retrieved from the Internet: URL:http://www.3gpp.org/ftp/Meetings_3GPP_SYNC/RANI/Docs/.

\* cited by examiner

APPARATUS AND METHOD FOR ENCODING AND DECODING USING POLAR CODE IN WIRELESS COMMUNICATION SYSTEM

CROSS-REFERENCE TO RELATED APPLICATION(S)

This application is based on and claims priority under 35 U.S.C. 119(a) of a Korean patent application number 10-2018-0036694, filed on Mar. 29, 2018, in the Korean Intellectual Property Office, the disclosure of which is incorporated by reference herein in its entirety.

BACKGROUND

1. Field

The disclosure relates to a wireless communication system. More particularly, the disclosure relates to an apparatus and a method for encoding and decoding using a polar code in a wireless communication system.

2. Description of Related Art

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'beyond 4G network' or a 'post long term evolution (LTE) system'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a 5G system, the use of a polar code has been discussed. The polar code proposed by Arikan is an initial error-correcting code which theoretically has an improved channel capacity. A concatenated outer code may be used to encode and decode information bits using the polar code and may include an error-detecting code (for example, a cyclic redundancy check (CRC) code) and an error-correcting code (for example, a parity check (PC) code).

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure provide a method and an apparatus for effectively performing encoding and decoding using a polar code in a wireless communication system.

Another aspect of the disclosure is to provide a method and an apparatus for stably and efficiently performing encoding and decoding using a polar code in a wireless communication system.

Another aspect of the disclosure is to provide a method and an apparatus for determining the number of parity check (PC) bits to be included in encoded data in a wireless communication system.

Another aspect of the disclosure is to provide a method and an apparatus for determining the number of PC bits based on parameters related to encoding of information bits in a wireless communication system.

Another aspect of the disclosure is to provide a method and an apparatus for determining the number of PC bits based on parameters related to decoding of information bits in a wireless communication system.

Another aspect of the disclosure is to provide a method and an apparatus for encoding information bits according to the determined number of PC bits in a wireless communication system.

Another aspect of the disclosure is to provide a method and an apparatus for decoding information bits according to the determined number of PC bits in a wireless communication system.

Another aspect of the disclosure is to provide a method and an apparatus for determining the number of information bits according to a predetermined condition in a wireless communication system.

Another aspect of the disclosure is to provide a method and an apparatus for performing encoding and decoding according to whether a predetermined condition is satisfied in a wireless communication system.

Additional aspects will be set forth in part in the description which follows and, in part, will be apparent from the description, or may be learned by practice of the presented embodiments.

According to an embodiment of the disclosure, a method of operating a transmitting end in a wireless communication system is provided. The method includes determining a number of PC bits, based on parameters related to encoding of information bits, encoding the information bits according to the number of PC bits, and transmitting the encoded information bits to a receiving end.

According to an embodiment of the disclosure, a method of operating a transmitting end in a wireless communication system is provided. The method includes determining a number of information bits, based on parameters related to encoding of information bits, encoding the information bits, based on the number of information bits, and transmitting the encoded information bits to a receiving end.

According to an embodiment of the disclosure, a method of operating a transmitting end in a wireless communication system is provided. The method includes determining whether to encode information bits, based on parameters related to encoding of the information bits, and performing scheduling according to whether the encoding is performed or transmitting the encoded information bits to a receiving end.

According to an embodiment of the disclosure, a method of operating a receiving end in a wireless communication system is provided. The method includes receiving encoded information bits from a transmitting end, determining a number of PC bits, based on parameters related to decoding of the information bits, and decoding the information bits according to the number of PC bits.

According to an embodiment of the disclosure, a method of operating a receiving end in a wireless communication system is provided. The method includes determining a number of information bits, based on parameters related to decoding of the information bits, decoding the information bits, based on the number of information bits, and transmitting the decoded information bits to a receiving end.

According to an embodiment of the disclosure, a method of operating a receiving end in a wireless communication system is provided. The method includes determining whether to decode information bits, based on parameters related to decoding of the information bits, and performing scheduling according to whether the decoding is performed or receiving the decoded information bits from a transmitting end.

According to an embodiment of the disclosure, an apparatus at a transmitting end in a wireless communication system is provided. The apparatus includes at least one processor, configured to determine a number of PC bits, based on parameters related to encoding of information bits and encode the information bits according to the number of PC bits, and a transceiver, configured to transmit the encoded information bits to a receiving end.

According to an embodiment of the disclosure, an apparatus at a transmitting end in a wireless communication system is provided. The apparatus includes at least one processor configured to determine a number of information bits based on parameters related to encoding of the information bits and encode the information bits based on the number of information bits, and a transceiver configured to transmit the encoded information bits to a receiving end.

According to an embodiment of the disclosure, an apparatus at a transmitting end in a wireless communication system is provided. The apparatus includes at least one processor configured to determine whether to encode information bits based on parameters related to encoding of the information bits, and a transceiver configured to perform scheduling according to whether the encoding is performed or transmit the encoded information bits to a receiving end.

According to an embodiment of the disclosure, an apparatus at a receiving end in a wireless communication system is provided. The apparatus includes a transceiver, configured to receive encoded information bits from a transmitting end, and at least one processor, configured to determine a number of PC bits based on parameters related to decoding of the information bits and decode the information bits according to the number of PC bits.

According to an embodiment of the disclosure, an apparatus at a receiving end in a wireless communication system is provided. The apparatus includes a transceiver, configured to receive encoded information bits from a transmitting end, and at least one processor, configured to determine a number of PC bits based on parameters related to decoding of the information bits and decode the information bits according to the number of PC bits.

According to an embodiment of the disclosure, an apparatus at a receiving end in a wireless communication system is provided. The apparatus includes at least one processor, configured to determine a number of information bits based on parameters related to decoding of the information bits and decode the information bits based on the number of information bits, and a transceiver, configured to transmit the decoded information bits to a receiving end.

According to an embodiment of the disclosure, a method for operating a first device in a wireless communication system is privided. The method includes generating a first bit sequence including information, generating a second bit sequence including at least one of the first bit sequence, at least one cyclic redundancy check (CRC) bits, at least one frozen bit or at least one parity bit, generating a transmission bit sequence by performing a polar encoding and a rate matching for the second bit sequence, and transmitting, to a second device, the transmission bit sequence. Herein, a length of the transmission bit sequence is equal to or greater than a sum of a length of the first bit sequence, a number of the CRC bits and a number of the at least one PC bit.

According to an embodiment of the disclosure, a method for operating a first device in a wireless communication system is provided. The method includes receiving, from a first device, a transmission bit sequence, and obtain a first bit sequence by decoding the transmission bit sequence. Herein, the transmission bit sequence is generated by generating the first bit sequence including information, generating a second bit sequence including at least one of the first bit sequence, at least one CRC bits, at least one frozen bit or at least one parity bit, generating the transmission bit sequence by performing a polar encoding and a rate matching for the second bit sequence. Herein, a length of the transmission bit sequence is equal to or greater than a sum of a length of the first bit sequence, a number of the CRC bits and a number of the at least one PC bit.

According to an embodiment of the disclosure, a first device in a wireless communication system is provided. The first device includes a transceiver, and at least one processor coupled to the transceiver. The at least one processor is configured to generate a first bit sequence including information, generate a second bit sequence including at least one of the first bit sequence, at least one CRC bits, at least one frozen bit or at least one parity bit, generate a transmission bit sequence by performing a polar encoding and a rate matching for the second bit sequence, and transmit, to a second device, the transmission bit sequence. Herein, a length of the transmission bit sequence is equal to or greater than a sum of a length of the first bit sequence, a number of the CRC bits and a number of the at least one PC bit.

According to an embodiment of the disclosure, a method for operating a first device in a wireless communication system is provided. The method includes generating a first bit sequence by performing code block segmentation for information bits, generating a second bit sequence by adding CRC bits to the first bit sequence, identifying a first set of bit indices for the second bits sequence or at least one parity and a second set of bit indices for at least one frozen bit based on reliabilities of bit indices that are predefined, generating a third bit sequence including at least one of the second bits sequence, the at least one frozen bit or the at least one parity bit according to the first set of bit indices and the second set of bit indices, generating a fourth bit sequence by multiplying the third bit sequence and a generation matrix for a polar encoding, generating a transmission bit sequence by performing a rate matching for the fourth bit sequence, and transmitting, to a second device, the transmission bit sequence. Herein, a length of the transmission bit sequence is equal to or greater than a sum of a length of the second bit sequence, and a number of the at least one PC bit.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
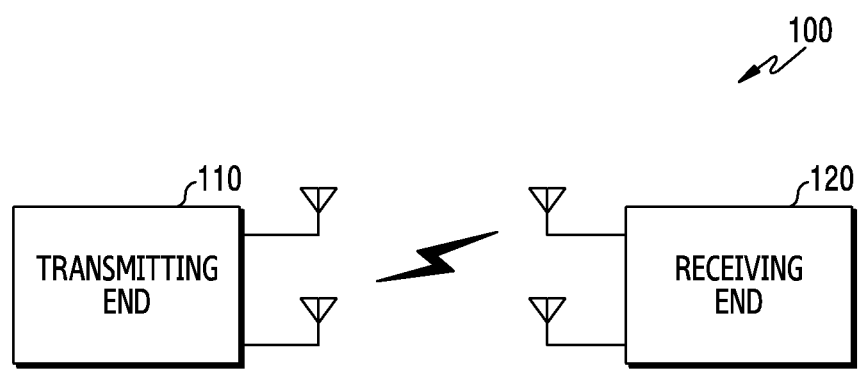
FIG. 1 illustrates a wireless communication system according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software and thus, the various embodiments of the disclosure may not exclude the perspective of software.

Hereinafter, the disclosure relates to an apparatus and a method for encoding and decoding using a polar code in a wireless communication system. Specifically, the disclosure describes a technology for determining the number of parity check (PC) bits based on parameters related to encoding and decoding of information bits in a wireless communication system.

Terms referring to parameters used in the following description, terms referring to a redundancy bit (for example, a PC bit), terms referring to an information bit, terms referring to a channel, terms referring to control information, terms referring to network entities, and terms referring to elements of a device are used only for convenience of description. Accordingly, the disclosure is not limited to the following terms, and other terms having the same technical meaning may be used.

Further, the disclosure describes various embodiments using the terms used in some communication standards (for example, $3^{rd}$ generation partnership project (3GPP)), but this is only an example. Various embodiments of the disclosure may be easily modified and applied to other communication systems.

In general, when data is transmitted and received between a transmitter and a receiver in a communication system, the data may contain errors due to noise existing in a communication channel. As an encoding scheme designed to make the receiver correct the error generated by the communication channel, there is an error-correcting code scheme. The error-correcting code is also referred to as channel coding. The error-correcting code scheme is a scheme for adding a redundant bit to data to be transmitted and transmitting the data.

The error-correcting code scheme includes various types. For example, the error-correcting code scheme includes convolutional coding, turbo coding, low-density parity-check (LDPC) coding, and polar coding types.

Among the error-correcting code schemes, the polar code is a code which theoretically has proved achievement of point-to-point channel capacity with low decoding complexity based on a channel polarization phenomenon generated in successive cancellation (SC) decoding. Further, it has been identified that the polar code has excellent practical performance as well as theoretical performance. Particularly, it has been identified that the polar code has better performance than other channel codes when using a concatenated outer code such as a CRC code and an SC-list (SCL) decoding. Accordingly, it is agreed that the polar code is used for transmitting control information through a control channel in 3GPP Release-15 new radio (NR).

The polar code is an error-correcting code proposed by E. Arikan in 2008 and corresponds to an initial error-correcting code which has low coding/complexity performance and has proved achievement of channel capacity corresponding to a data transmission limit in binary discrete memoryless channels (B-DMCs). The polar code has an advantage of error-correcting performance and decoding complexity in transmission of a code having a short length in comparison with a turbo code and a LDPC code, which are other capacity-approaching codes. Due to this advantage, it is determined that the polar code is used for transmitting control information having a short length in 3GPP NR standardization, which was conducted for $5^{th}$ generation (5G) mobile communication in 2007.

The disclosure relates to, when error and loss occur due to various causes such as noise and interference during a process of transmitting or storing data or when there is room for such error and loss, error-correcting codes for correcting the error and loss and performing reconstruction. Specifically, the disclosure relates to encoding and decoding of the polar code and an apparatus and a method for more efficiently encoding and decoding information during a process of transmitting and receiving information in a mobile communication system and a broadcasting system.

FIG. 1 illustrates a wireless communication system according to various embodiments of the disclosure.

Referring to FIG. 1, a transmitting end 110 and a receiving end 120 are parts of nodes using a radio channel in a wireless communication system. Although FIG. 1 illustrates one transmitting end 110 and one receiving end 120, the system may include a plurality of transmitting ends or a plurality of receiving ends. For convenience of description, the transmitting end 110 and the receiving end 120 are described as separate entities in this document, but the functions of the transmitting end 110 and the receiving end 120 may be exchanged. For example, in the case of uplink in a cellular communication system, the transmitting end 110 may be a terminal and the receiving end 120 may be a base station (BS). In the case of downlink, the transmitting end 110 may be a BS and the receiving end 120 may be a terminal.

Referring to FIG. 1, in some embodiments, the transmitting end 110 may determine the number of PC bits based on parameters related to coding of information bits, code the information bits according to the number of PC bits, and transmit the coded information bits to the receiving end 120. In some embodiments, the receiving end 120 may receive coded information bits from the transmitting end, determine the number of PC bits based on parameters related to decoding of the information bits, and decode the information bits according to the number of PC bits.

Figure 2:
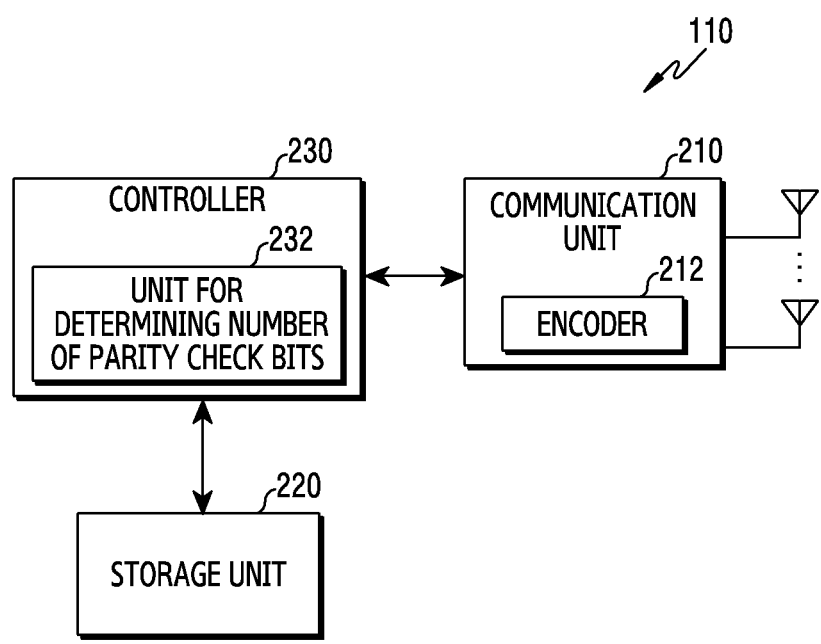
FIG. 2 illustrates an example of a configuration of a transmitting-end apparatus in a wireless communication system according to various embodiments of the disclosure.

FIG. 2 illustrates an example of a configuration of a transmitting-end apparatus in a wireless communication system according to various embodiments of the disclosure. That is, the configuration illustrated in FIG. 2 may be understood as the configuration of the transmitting end 110. The term " . . . unit" or the suffix of a word, such as " . . . or", " . . . er", or the like may indicate a unit for processing at least one function or operation, and this may be embodied by hardware, software, or a combination of hardware and software.

Referring to FIG. 2, the transmitting end 110 may include a communication unit 210, a storage unit 220, and a controller 230.

The communication unit 210 may perform functions for transmitting and receiving a signal through a radio channel. For example, the communication unit 210 may perform a function for conversion between a baseband signal and a bitstream according to a physical layer standard of a system. For example, in data transmission, the communication unit 210 may generate complex symbols by coding and modulating a transmission bitstream. In data reception, the communication unit 210 may reconstruct a reception bitstream through demodulation and decoding of the baseband signal.

Further, the communication unit 210 may up-convert a baseband signal into a radio frequency (RF) band signal and then transmit the same through an antenna, and may down-convert an RF band signal received through an antenna into a baseband signal.

To this end, the communication unit 210 may include a transmission filter, a reception filter, an amplifier, a mixer, an oscillator, a digital-to-analog convertor (DAC), an analog-to-digital convertor (ADC), and the like. Further, the communication unit 210 may include a plurality of transmission/reception paths. In addition, the communication unit 210 may include at least one antenna array including a plurality of antenna elements. On the hardware side, the communication unit 210 may include a digital unit and an analog unit, and the analog unit may include a plurality of subunits according to operation power, operation frequency, and the like.

The communication unit 210 transmits and receives the signal as described above. Accordingly, the communication unit 210 may be referred to as a "transmitter", a "receiver", or a "transceiver". Also, the transmission and reception performed through a radio channel may be understood to mean that the above-described processing is performed by the communication unit 210 in the following description. The communication unit 210 may further include a backhaul communication unit for communication with another network entity connected through a backhaul network.

The communication unit 210 may include an encoder 212 to perform encoding according to various embodiments of the disclosure. The communication unit 210 may code information bits to be transmitted based on the number of PC bits determined through the controller 230.

The storage unit 220 may store a basic program, an application, and data such as setting information for the operation of the transmitting end 110. The storage unit 220 may be configured as volatile memory, nonvolatile memory, or a combination of volatile memory and nonvolatile memory. The storage unit 220 may provide stored data in response to a request from the controller 230.

The controller 230 may control the overall operation of the transmitting end 110. For example, the controller 230 may transmit and receive signals through the communication unit 210. Further, the controller 230 may record data in the storage unit 220 or read the data. To this end, the controller 330 may include at least one processor or microprocessor, or may play the part of the processor. In other words, the controller 230 may control the operation of each element included in the communication unit 210.

According to various embodiments, the controller 230 may include a unit 232 for determining the number of PC bits. The unit 232 for determining the number of PC bits may determine the number of PC bits based on parameters related to coding of information bits. The controller 230 may control the communication unit 210 to code the information bits according to the determined number of PC bits and to transmit the coded information bits to the receiving end. For example, the controller 230 may control the transmitting end to perform operations according to various embodiments described below.

Figure 3:
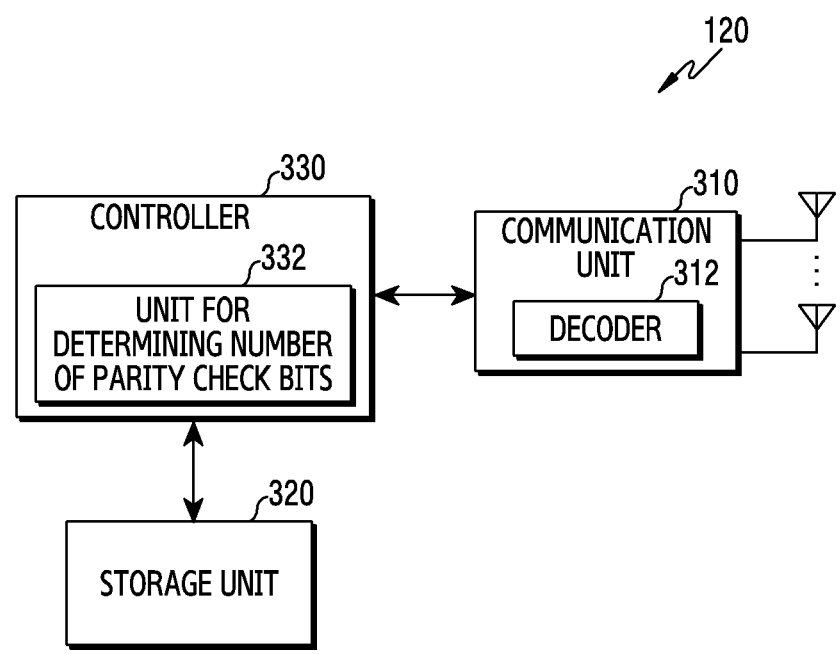
FIG. 3 illustrates an example of a configuration of a receiving apparatus in a wireless communication system according to various embodiments of the disclosure.

FIG. 3 illustrates an example of a configuration of a receiving apparatus in a wireless communication system according to various embodiments of the disclosure. That is, the configuration illustrated in FIG. 3 may be understood as the configuration of the receiving end 120. The term " . . . unit" or the ending of a word, such as " . . . or", " . . . er", or the like may indicate a unit of processing at least one function or operation, and this may be embodied by hardware, software, or a combination of hardware and software.

Referring to FIG. 3, the receiving end 120 may include a communication unit 310, a storage unit 320, and a controller 330.

The communication unit 310 may perform functions for transmitting and receiving a signal through a radio channel. For example, the communication unit 310 may perform a function for conversion between a baseband signal and a bitstream according to a physical layer standard of a system. For example, in data transmission, the communication unit 310 may generate complex symbols by coding and modulating a transmission bitstream. In data reception, the communication unit 310 may reconstruct a reception bitstream through demodulation and decoding of the baseband signal. Further, the communication unit 310 may up-convert a baseband signal into a RF band signal and then transmit the same through an antenna, and may down-convert an RF band signal received through an antenna into a baseband signal.

To this end, the communication unit 310 may include a transmission filter, a reception filter, an amplifier, a mixer, an oscillator, a DAC, an ADC, and the like. Further, the communication unit 310 may include a plurality of transmission/reception paths. In addition, the communication unit 310 may include at least one antenna array including a plurality of antenna elements. On the hardware side, the communication unit 310 may include a digital unit and an analog unit, and the analog unit may include a plurality of subunits according to operation power, operation frequency, and the like.

The communication unit 310 transmits and receives the signal as described above. Accordingly, the communication unit 310 may be referred to as a "transmitter", a "receiver", or a "transceiver". Also, the transmission and reception performed through a radio channel may be understood to mean that the above-described processing is performed by the communication unit 310 in the following description. The communication unit 310 may further include a backhaul communication unit for communication with another network entity connected through a backhaul network.

The communication unit 310 may include a decoder 312 to perform decoding according to various embodiments of the disclosure. The communication unit 310 may decode the received information bits based on the determined number of PC bits through the controller 330.

The storage unit 320 may store a basic program, an application, and data such as setting information for the operation of the receiving end 120. The storage unit 320 may be configured as volatile memory, nonvolatile memory, or a combination of volatile memory and nonvolatile memory. The storage unit 320 may provide stored data in response to a request from the controller 330.

The controller 330 may control the overall operation of the receiving end 120. For example, the controller 330 may transmit and receive signals through the communication unit 310. Further, the controller 330 may record data in the storage unit 320 or read the data. To this end, the controller 330 may include at least one processor or microprocessor, or may play the part of the processor. In other words, the controller 330 may control the operation of each element included in the communication unit 310.

According to various embodiments, the controller 330 may include a unit 332 for determining the number of PC bits. The unit 332 for determining the number of PC bits may determine the number of PC bits based on parameters related to decoding of the information bits. The controller 330 may control the communication unit 310 to receive the coded information bits from the transmitting end according to the determined number of PC bits and to decode the coded information bits. For example, the controller 330 may control the receiving end to perform operations according to various embodiments described below.

Figure 4:
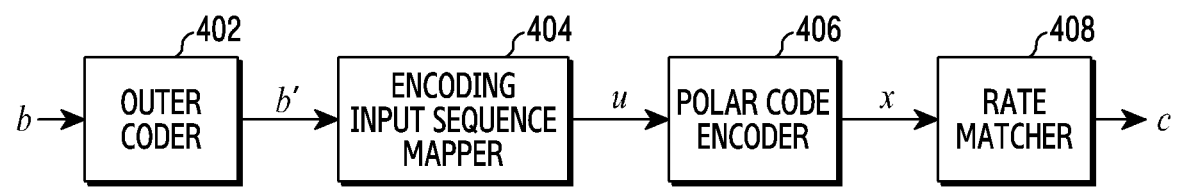
FIG. 4 illustrates a functional configuration of a transmitting apparatus for performing encoding in a wireless communication system according to various embodiments of the disclosure.

FIG. 4 illustrates a functional configuration of the transmitting apparatus for performing encoding in a wireless communication system according to various embodiments of the disclosure. The transmitting end illustrated in FIG. 4 may be understood as part of the communication unit 210 of the transmitting end 110 of FIG. 1.

Referring to FIG. 4, the transmitting end 110 includes an outer coder 402, an encoding input sequence mapper 404, a polar code encoder 406, and a rate matcher 408.

In some embodiments, other devices may be added or omitted according to the requirements of the system. The number of information bits that the transmitting end transmits is K and the number of codeword bits that are polar-coded and transmitted through a channel may be expressed as E.

In some embodiments, the transmitting end 110 generates an information bit sequence. For example, the transmitting end 110 inputs the information bit sequence $b=\{b_0, b_1, \ldots, b_{K-1}\}$ to be transmitted to the outer coder 402. The information bit sequence may be referred to as a segment as part of all of the information to be transmitted.

The outer coder 402 may perform outer coding on the input information bit sequence. For example, the outer coder 402 may code the input information bit sequence b in order to improve performance. The outer coder may be generally used to increase performance of a maximum likelihood (ML)-like decoder that performs decoding in consideration of a plurality of codeword candidates, like SCL decoding or SC-stack (SCS) decoding of the polar code. In some embodiments, an error-detecting code such as a cyclic redundancy check (CRC) code or an error-correcting code such as a Bose, Chaudhuri, and Hocquenghem (BCH) code and a PC code may be used as the outer code. Only one outer code may be used, or two or more outer codes may be used together. In some embodiments, the length of all parity bits generated by one or more outer codes may be expressed as L, and a bit sequence generated as a result of the outer coding may be expressed as $b'=\{b'_0, b'_1, \ldots, b'_{K+L-1}\}$. In other embodiments, if the outer coding is not considered, L=0 and b'=b, and the outer coder 402 may be omitted.

The encoding input sequence mapper 404 may map the bit sequence generated as the result of the outer coding to the bit sequence for the polar coding. That is, the encoding input sequence mapper 404 may map or allocate the bit sequence to an N-length bit sequence $u=\{u_0, u_1, \ldots, u_{K-1}\}$ for polar coding of the bit sequence b'. In some embodiments, N denotes the size of a mother code of the polar code, and may be indicated by a power of 2, and may be determined according to a preset reference among values larger than a value generated by adding the information bits and the length of all parity bits generated by the outer code. In some embodiments, u denotes the input bit sequence of the polar code encoder 406, and bits of the output bitstream b' of the outer coder 402 may be mapped to u according to a predetermined method and reference. The mapping method may be performed in consideration of a rate-matching operation to be performed later. For example, in the case of a polar code in 3GPP Release-15 NR, a bit index u to which each bit of the output bitstream b' is mapped is predefined in a sequence form. Each bit of the coding input bit sequence u acquired through the operation may be analyzed such that each bit passes through sub channels (or split channels) having different qualities by channel polarization. Due to the above-described characteristics, a process of mapping b' to u may be a sub-channel allocation process which may be performed by the encoding input sequence mapper 404. In some embodiments, among the bits of u, bits of u corresponding to sub-channels to which b' is mapped may be unfrozen bits, and bits of u corresponding to the remaining sub-channels may be referred to as frozen bits. In some embodiments, the unfrozen bits may be fixed to a preset value, which generally may be set to 0.

The polar code encoder 406 may receive the generated coding input bit sequence from the encoding input sequence mapper 404 and perform polar code encoding. That is, the polar code encoder 406 may receive the generated coding input bit sequence u from the encoding input sequence mapper 404, perform polar code encoding, and output a bit sequence having the same length. Specifically, the polar code encoder 406 may generate an encoding output bit sequence $v=\{v_0, v_1, \ldots, v_{K-1}\}$ having the same length N by multiplying the encoding input bit sequence u having the length N and a generator matrix G of the polar code. In general, the generator matrix G of the polar code may be defined as Equation 1.

$$G = B_N F^{\otimes \log_2 N} \quad \text{Equation 1}$$

In Equation 1, G denotes a generator matrix $$F = \begin{bmatrix} 1 & 0 \\ 1 & 1 \end{bmatrix},$$

N denotes the size of a mother code of the polar code, and an operation of superscript ⊗n denotes n of Kronecker power. For example, $$F^{\otimes 2} = \begin{bmatrix} F & 0 \\ F & F \end{bmatrix} \text{ and } F^{\otimes 3} = \begin{bmatrix} F^{\otimes 2} & 0 \\ F^{\otimes 2} & F^{\otimes 2} \end{bmatrix}.$$

Further, $B_N$ is an N×N bit-reversal permutation matrix. For example, $\{a_0, a_1, a_2, a_3, a_4, a_5, a_6, a_7\}$ may be acquired by multiplying $\{a_0, a_1, a_2, a_3, a_4, a_5, a_6, a_7\}$ and $B_8$. However, the following generator matrix in the simple form, except for $B_N$, used in various recent documents and systems including 3GPP NR may be defined as Equation 2.

$$G = F^{\otimes \log_2 N} \quad \text{Equation 2}$$

In Equation 2, G denotes a generator matrix $$F = \begin{bmatrix} 1 & 0 \\ 1 & 1 \end{bmatrix},$$

N denotes the size of a mother code of the polar code, and an operation of superscript ⊗n denotes a Kronecker power of n. In the following embodiments of the disclosure, unless mentioned otherwise, the generator matrix may be defined as $G = F^{\otimes \log_2 N}$. The content based on the assumption may be easily described with a change of the polar code using a generator matrix defined as $G = B_N F^{\otimes \log_2 N}$ based on a bit-reversal permutation operation. Multiplication of the generator matrix can be implemented through various methods of outputting the same result.

The rate matcher 408 may output the output bit sequence of the polar code encoder 406 as the bit sequence. That is, the rate matcher 408 may receive the output bit sequence x from the polar code encoder 406 and output a bit sequence having a length E to be transmitted. In some embodiments, a process of generating, from the encoded output bit sequence x, the bit sequence having the length E to be transmitted may be referred to as rate matching. In some embodiments, a transmission bit sequence that can be acquired through rate matching may be expressed as c={$c_0$, $c_1$, ..., $c_{N-1}$}. In some embodiments, the rate matcher 408 may rearrange the encoding output bit sequence x in order to improve encoding and decoding performance of the polar code. For example, in the polar code of 3GPP Release-15 NR, the encoding output bit sequence x may be interleaved in units of 32 sub-blocks and rearranged to be x'={$x'_0$, $x'_1$, ..., $x'_{N-1}$}. Further, the rate matcher 408 may store x' in a circular buffer, extract x' sequentially starting at a preset bit, and generate a codeword sequence of a length E.

A more detailed operation of the rate matcher 408 is described below. In some embodiments, when the length E of the codeword is larger than the size N of the mother code of the polar code, the rate matcher 408 may perform a repetition operation. In some embodiments, when the length E of the codeword is smaller than the size N of the mother code of the polar code, the rate matcher 408 may perform one of puncturing and shortening operations. In some embodiments, in a process of allocating sub-channels by the encoding input sequence mapper 404, some sub-channels may not be allocated for information bits by punctured or shortened bits. The shortening process of the rate matcher 408 may include a process of mapping frozen bits to preset bits in the input bit sequence u of the polar code such that preset bits become "0" in the encoding output bit sequence x. In some embodiments, the rate matcher 408 may not transmit bits preset as "0" in the encoding output bit sequence x. The rate matcher 408 may puncture preset bits in the output bit sequence x of the encoding input sequence mapper 404 through the puncturing process and may not transmit the preset bits. The rate matcher 408 may map zero-capacity bits which cannot transmit information in the input bit sequence u of the polar code to frozen bits based on the location of a preset bit which is not transmitted in the output bit sequence x. The process of encoding the polar code has been described based on necessary operations, but portions of the process may be omitted or separate operations may be added depending on the requirements and characteristics of the system.

Figure 5:
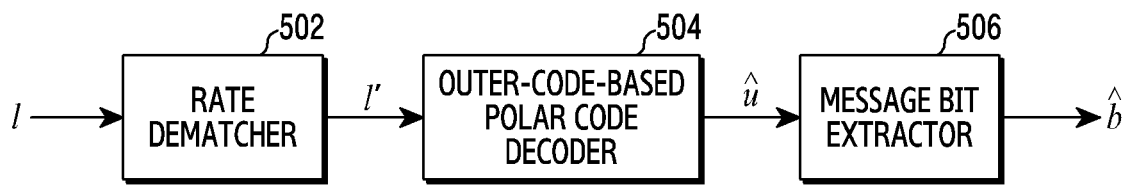
FIG. 5 illustrates the functional configuration of a receiving apparatus for performing decoding in a wireless communication system according to various embodiments of the disclosure.

FIG. 5 illustrates the functional configuration of the receiving apparatus for performing decoding in a wireless communication system according to various embodiments of the disclosure. The configuration illustrated in FIG. 5 may be understood as the part of the communication unit 310 of the receiving end 120 of FIG. 1.

Referring to FIG. 5, the receiving end 120 may include a rate dematcher 502, an outer-code-based polar code decoder 504, and a message bit extractor 506. The outer-code-based polar code decoder 504 may be referred as an outer-code-aided SC list decoder. In some embodiments, other devices may be added or omitted depending on the requirements of the system.

Although not explicitly described in the disclosure, the receiving end 120 may include a demodulated log-likelihood ratio (LLR) generator in some embodiments. The demodulated LLR generator may demodulate a received signal to acquire a LLR corresponding to a bit c transmitted from the transmitting end. In some embodiments, an LLR sequence corresponding to the transmission bit sequence c may be expressed as l={$l_0$, $l_1$, ..., $l_{N-1}$}.

The rate dematcher 502 inversely performs the rate-matching process performed by the transmitting end 110 in order to input the LLR sequence generated through the demodulated LLR generator to the polar code decoder 504. That is, the rate dematcher 502 may perform the inverse process of rate matching performed by the transmitting end 110 in order to input an LLR sequence l having a length E to the polar code decoder 504 having a mother code having a length N. In some embodiments, when a puncture is generated in the rate matcher 408 of the transmitter, the rate dematcher 502 may determine an LLR value for the corresponding bit having the generated puncture as 0. In some embodiments, when shortening is performed in the rate matcher 408 of the transmitter, the rate dematcher 502 may determine an LLR value for the corresponding bit having the generated shortening as a maximum value of the LLR value corresponding to a bit value 0. In some embodiments, when repetition is performed on a particular bit, the rate dematcher 502 may determine an LLR value for the repeated bit by combining all the corresponding LLR values. In some embodiments, the LLR sequence having the length N determined through the above-described process may be l={$l_0$, $l_1$, ..., $l_{N-1}$}.

Through a SC-based decoding scheme, the outer-code-based polar code decoder 504 may decode the LLR sequence generated through the rate dematcher 502. For example, the outer-code-based polar code decoder 504 may perform SC-based decoding of the polar code for the LLR sequence having the length N generated through the rate dematcher 502. In various embodiments, the SC-based decoding scheme may include SCL and SCS decoding schemes. Various embodiments of the disclosure described below may be performed in consideration of SCL decoding. However, the disclosure is not limited to a specific decoding scheme such as the SCL decoding scheme. In some embodiments, when the number of concatenated outer codes is one or more, the outer-code-based polar code decoder 504 may improve SCL decoding performance using parity bits of the concatenated outer codes during SCL decoding or after the decoding. In some embodiments, the outer-code-based polar code decoder 504 may output an estimated value û of an encoding input bit sequence u' of the transmitting end 110 through the above-described decoding.

The message bit extractor 506 may extract a message bit at a predetermined location from the estimated value of the encoding input bit sequence output from the outer-code-based polar code decoder 504. That is, the message bit extractor 506 may acquire a message bit at a predetermined location from an estimated encoding input bit sequence û. The message bit sequence extracted through the operation of the message bit extractor 506 may be b̂. The process of decoding the polar code has been described based on operations necessary therefor, but portions of the process may be omitted or a separate operation may be added depending on the requirements and characteristics of the system.

In some embodiments, the concatenated outer codes may be broadly divided into two codes in order to increase the SCL decoder performance of the polar code by the encoding input sequence mapper 404 in the encoding process of FIG. 4. First, the outer codes may include a code such as a CRC code for selecting codewords containing no errors by performing error check for L codeword candidates finally acquired through SCL decoding. Secondly, the outer codes may include a code such as a PC code designed to determine whether to perform pruning for a partial path (or list)

acquired during SCL decoding. However, the disclosure is not limited to the two codes resulting from division of the outer codes, and different types of outer codes may be used. In some embodiments, each parity bit of the code designed to determine whether to perform pruning during decoding may be generated through linear combination of bits to be decoded before each parity bit in SC-based decoding. For example, when one of the parity bits of the PC code corresponds to an $m^{th}$ decoded bit in SC-based decoding, the parity bit may be generated by linear combination of some or all of the bits from a first bit to an $m-1^{th}$ bit. In some embodiments, the parity bit of the PC code may be distinguished from a parity bit of another normal concatenated outer code. The parity bit of another concatenated code such as the CRC code may be treated as an unfrozen bit, the same as the information bit, by the polar code decoder. However, the decoder of the polar code may use the parity bit of the PC code only for reconstructing another information bit and a parity bit of another concatenated outer code. In this case, the decoder of the polar code may process the parity bit of the PC code equally or similarly to the frozen bit rather than the unfrozen bit. In some embodiments, when the encoder and the decoder of the polar code calculate a code rate, the parity bit of the PC code may not be reflected as the input bit. That is, since the code rate may be determined as "(number of unfrozen bits)/(number of transmission bits)= (number of information bits+number of other concatenated outer code parity bits)/(number of transmission bits)", the parity bit of the PC code may not be reflected in the determination of the code rate. In some embodiments, the parity bit of the PC code may be referred to as a PC frozen bit or a dynamic frozen bit. In various embodiments of the disclosure described below, when the parity bit of the PC code is treated as the frozen bit by the decoder and used for reconstructing another information bit, the PC bit may be referred to as a PC frozen bit. In some embodiments, when the code rate is larger than 1, reconstruction containing no errors may be impossible. Therefore, (number of information bits+number of other concatenated outer code parity bits) should be smaller than the number of transmission bits.

In some embodiments, the parity bit of the PC code is generally treated as the frozen bit, as described in the operation of the decoder of the receiving end, but may be treated as the unfrozen bit in some operations of the receiving end. For example, in the case of early termination of SC-based decoding using the distributed CRC code or the parity bit of the PC code, the receiving end may determine that the parity bit of the PC code is the frozen bit. In this case, since the code rate is calculated as "(number of unfrozen bits)/(number of transmission bits)=(number of information bits+number of all outer code parity bits including parity code)/(number of transmission bits)", if the code rate is larger than 1, it is impossible to perform decoding at a low error rate. Therefore, (number of information bits+number of all outer code parity bits including PC code) should be smaller than the number of transmission bits.

In various embodiments of the disclosure, the polar code using the PC code may be considered in the concatenated outer coding. The PC code may be solely concatenated with the polar code or may be used as one of several concatenated codes. For example, in the 3GPP Release-15 NR standard, when the information bit length is longer than or equal to 12 and equal to or smaller than 19 and uplink control information (UCI) is transmitted, a CRC code having a length of 6 bits and a PC code having a length of 3 bits may be used as concatenated outer codes of the polar code. In some embodiments, the polar code in which the CRC code and the PC code are concatenated may be referred to as a CRC-aided-and-PC (CA-PC) polar code. Further, in some embodiments, only the PC code may be concatenated with the polar code, and the code may be referred to as a PC polar code. In some embodiments, the number of parity bits, that is, PC frozen bits generated by the PC code of the outer concatenated codes, may be $L_{pc}$, and the number of parity bits generated by the remaining concatenated outer codes may be $L_{other}$. Accordingly, the number of parity bits generated by all concatenated outer codes may be $L=L_{pc}+L_{other}$.

Figure 6A:
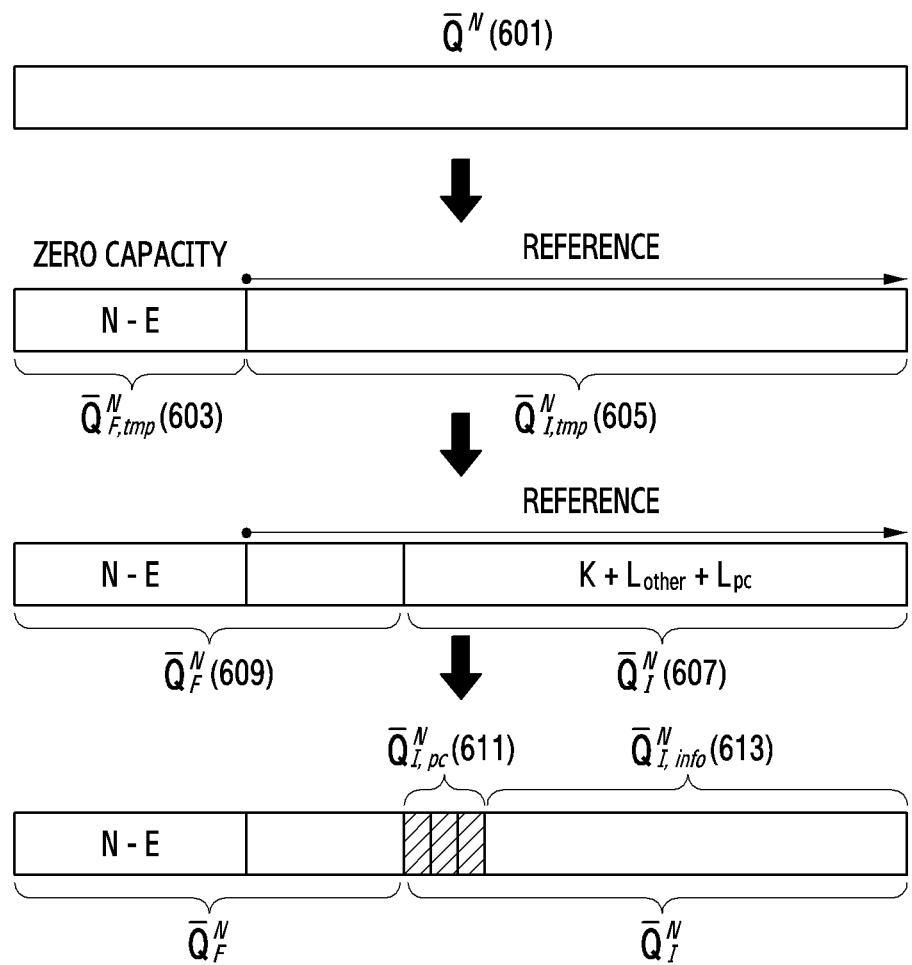
FIG. 6A illustrates an example of sub-channel allocation using a concatenated outer code in a wireless communication system according to various embodiments of the disclosure.
Figure 6B:
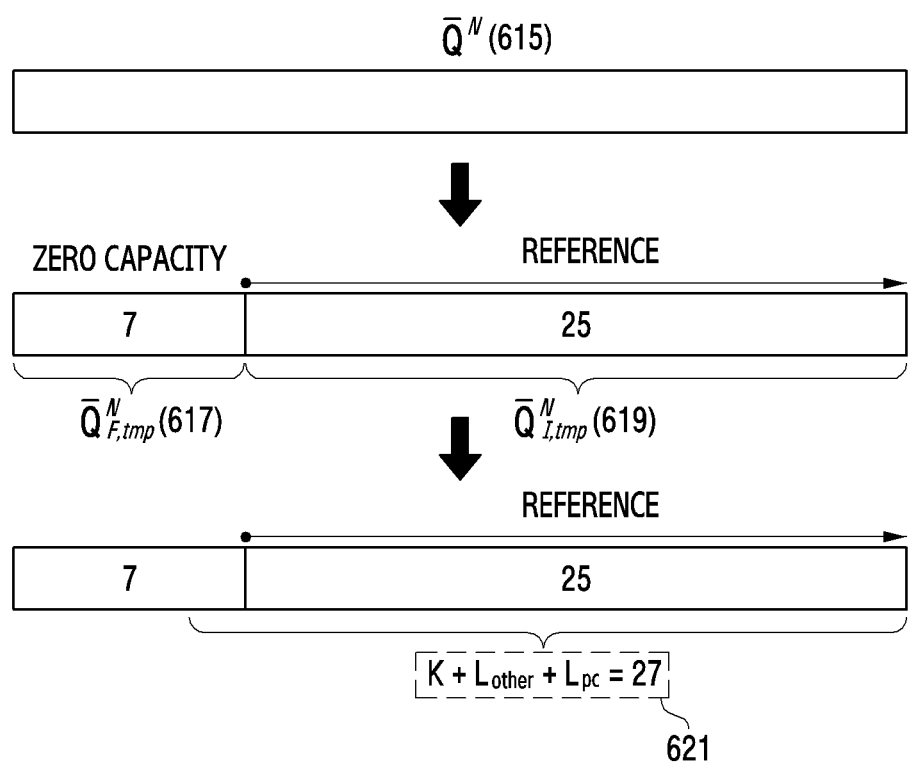
FIG. 6B illustrates an example of sub-channel allocation using a concatenated outer code in a wireless communication system according to various embodiments of the disclosure.

In the disclosure, a sub-channel allocation process of the polar code used for concatenated outer coding of the PC code may be performed as illustrated in FIGS. 6A and 6B. Detailed symbols indicating the parameters used in FIGS. 6A and 6B are only examples, and do not limit the scope of the disclosure.

FIG. 6A illustrates an example of sub-channel allocation using a concatenated outer code in a wireless communication system according to various embodiments of the disclosure. FIG. 6A illustrates a method of operating the transmitting end 110 of FIG. 1. However, the following operations may be equally performed for the receiving end 120 of FIG. 1.

Referring to FIG. 6A, the transmitting end may determine the size N of the mother code of the polar code to be used according to a preset reference based on predetermined parameters (for example, the length of information bits, the length of codewords, and the code rate). In some embodiments, a bit index set of the encoding input bit sequence u may be expressed as $\overline{Q}^N=\{0, 1, \ldots, N-1\}$ 601.

Further, the transmitting end may determine a bit index set $\overline{Q}_{F,tmp}^N$ 603 which cannot be used by rate matching in the bit index set $\overline{Q}^N=\{0, 1, \ldots, N-1\}$ 601 having the length N. In some embodiments, when the rate matcher of the polar code punctures or shortens some bits of the encoding output bit sequence x, some bits at the corresponding location in the encoding input bit sequence u may be zero-capacity bits that cannot transmit information. In some embodiments, the transmitting end may determine the location of the zero-capacity bits of the encoding input bit sequence according to which bits are punctured or shortened in the encoding output bit sequence x and, accordingly, determine the bit index set $\overline{Q}_{F,tmp}^N$ 603.

The transmitting end may determine a bit index set $\overline{Q}_{I,tmp}^N$ 605 which is obtained by excluding the $\overline{Q}_{F,tmp}^N$ 603 from the bit index set $\overline{Q}^N=\{0, 1, \ldots, N-1\}$ having the length N. That is, $\overline{Q}_{I,tmp}^N$ 605 may be determined as $\overline{Q}^N \backslash \overline{Q}_{F,tmp}^N$. Here, an operator "\" indicates a set minus operation. In some embodiments, when puncturing and shortening are performed, the length E of the codeword and the size of the set $\overline{Q}_{I,tmp}^N$ 605 are the same. However, when repetition is performed, the length E of the codeword and the size of the set $\overline{Q}_{I,tmp}^N$ 605 may not be the same.

The transmitting end may select indexes corresponding to the size of b' (bit sequence including an information bit and a parity code of a concatenated outer code) to be transmitted in the bit index set $\overline{Q}_{I,tmp}^N$ 605 according to a particular criterion and determine a bit index set $\overline{Q}_I^N$ 607. The criterion may be determined based on a value related to channel polarization of the polar code, such as reliability. In some embodiments, a set of the remaining bit indexes $\overline{Q}_F^N=\overline{Q}^N \backslash \overline{Q}_I^N$ 609 obtained by excluding the $\overline{Q}_I^N$ 607 from the whole sequence may correspond to a set of the frozen bit sequence.

In some embodiments, the transmitting end may preferentially determine bit indexes to which some or all of the parity bits of the concatenated outer code are mapped in the bit sequence $\overline{Q}_I^N$ 607. According to an embodiment of the disclosure, the transmitting end may preferentially determine bit indexes to which PC frozen bits of the concatenated code are mapped. As defined above, the number of parity bits of the PC code may be expressed as $L_{pc}$, and a set of the bit indexes to which the parity bits of the PC code are mapped may be expressed as $\overline{Q}_{I,pc}^{N}$ 611. According to various embodiments of the disclosure, the number of parity bits of the PC code may be the number of PC bits. In some embodiments, the location of the bits to which the parity bits of the PC code are mapped may be determined in consideration of reliability of bits according to channel encoding or characteristics of columns of the corresponding generator matrix. For example, $L_{pc}$ bit indexes having low reliability according to channel polarization or a low hamming weight of columns of the corresponding generator matrix in the bit index $\overline{Q}_{I}^{N}$ 607 may be configured as $\overline{Q}_{I,pc}^{N}$ 611.

In some embodiments, the receiving end may determine that the remaining bit indexes obtained by excluding the determined $\overline{Q}_{I,pc}^{N}$ 611 from the bit index set $\overline{Q}_{I}^{N}$ 607 are bit indexes to which $K+L_{other}$ information bits and parity bits of the remaining concatenated outer code (for example, CRC code) are mapped. The bit index set may be expressed as $\overline{Q}_{I,info}^{N}$ 613.

The processes of FIG. 6A are parts of the operation for encoding data and may be performed when encoding for data transmission by the transmitting end is performed. Alternatively, the processes of FIG. 6A are procedures for determining in advance indexes to which bits are mapped, and may be performed in advance or stored in the transmitting end in the form of a predefined rule or setting.

Through the processes of FIGS. 6A and 6B, general processes of sub-channel allocation of the polar code used for concatenated outer coding of the PC code may be described. A detailed example of the sub-channel allocation may be described through FIG. 6B below.

FIG. 6B illustrates an example of sub-channel allocation using a concatenated outer code in a wireless communication system according to various embodiments of the disclosure. FIG. 6B illustrates a method of operating the receiving end 120 of FIG. 1. However, the following operations may be performed equally for the receiving end 120 of FIG. 1.

According to various embodiments, the number $L_{pc}$ of PC frozen bits may be variable by a predetermined rule, for example, a length of codeword bits, uplink/downlink, a user equipment (UE) category, and UE capacity, or may be a predetermined fixed value. In general, a fixed value may be used for consistent operation of the system. For example, when the CA-PC polar code of 3GPP Release-15 NR, agreed upon in March 2018, is used, $L_{pc}$ is always fixed to 3, regardless of other parameters. When the PC frozen bit having the fixed length is considered, the system consistently operates all the time, so that hardware operation and implementation may be simplified.

As described above, when the fixed $L_{pc}$ is used for simplification of the system, the operation of sub-channel allocation may be impossible according to given or determined transmission parameters (the information bit length K, the parity bit lengths $L_{pc}$ and $L_{other}$ of the concatenated outer code, and the codeword bit length E) and the configuration of the polar code (the size N of the mother code). For example, the size of the set $\overline{Q}_{I,tmp}^{N}$ of the remaining bit indexes considering rate matching may be smaller than the length K+L of the parity bits of the concatenated outer code including information bits and PC frozen bits to be mapped to bits having the bit indexes.

Specifically, when UCI having a length of 12≤K≤12 is given, the CA-PC polar code may be used, and at this time, a CRC code of 6 bits and a PC code of 3 bits may be used as concatenated outer codes. In some embodiments, when the length K of information bits is 18 and the length E of codeword bits to be transmitted is 25, the PC frozen bits are treated as frozen bits by the decoder of the polar code as described above, and thus the number of unfrozen bits handled by the encoder and the decoder of the polar code is the sum of 18 bits, corresponding to the information bits, and 6 bits, corresponding to the CRC parity bits, that is, a total of 24 bits. Since the length 24 of unfrozen bits is smaller than the length 25 of bits to be transmitted, the code rate is lower than 1. In this case, when a signal-to-noise ratio (SNR) of a transmission channel is high, the transmitting end may transmit information bits. Accordingly, the transmitting end and the receiving end may perform encoding and decoding in consideration of transmission of information on the parameter.

Referring to FIG. 6B, the size N of a mother code 615 of the polar code may be determined to be 32. Further, the number of punctured or shortened bits 617 corresponds to 7 bits, obtained by subtracting E from the size N of the mother code. The transmitting end may determine $\overline{Q}_{I,tmp}^{N}$ 619 in consideration of the punctured or shortened bits of 7 bits, and accordingly the size of $\overline{Q}_{I,tmp}^{N}$ 619 may be determined as 25, which is the same as the length E of codeword bits. In this case, bits 621 to be mapped to bit indexes of $\overline{Q}_{I,tmp}^{N}$ 619 in the sub-channel allocation process correspond to 18 information bits, 6 CRC parity bits, and 3 PC frozen bits, that is, a total of 27 bits. Accordingly, the transmitting end cannot select the 27 bits as mapping bits in $\overline{Q}_{I,tmp}^{N}$ 619 and thus cannot configure the CA-PC polar code. Specifically, the number $L_{other}$ of CRC bits is 6 and the number $L_{pc}$ of PC frozen bits is 3, so that a condition which does not define the encoding and decoding operation may be defined as E−(K+6)<3.

As described above, in some embodiments, when the number $L_{pc}$ of PC bits is determined as a fixed value in the polar code using the PC code as the concatenated outer code, when the length of codeword bits is smaller than a sum of the number of information bits, the number of CRC bits, and the number of PC bits, that is, when $E<K+L_{other}+L_{pc}$, or when a value obtained by subtracting a sum of the number of information bits and the number of CRC bits from the length of codeword bits is smaller than the number of PC bits, that is, when $E-(K+L_{other})<L_{pc}$, the encoding and decoding operation of the transmitting end and the receiving end may not be defined.

Accordingly, when encoding of the polar code using the PC code as the concatenated outer code is not defined for a particular parameter value, various embodiments of the disclosure propose a solution that can be used in viewpoints of a system and implementation. In case that the encoding and decoding operation of the transmitting end and the receiving end is not defined, a process in which the transmitting end and the receiving end determine the number of PC bits will be described with reference to FIGS. 7 and 8 below.

Figure 7:
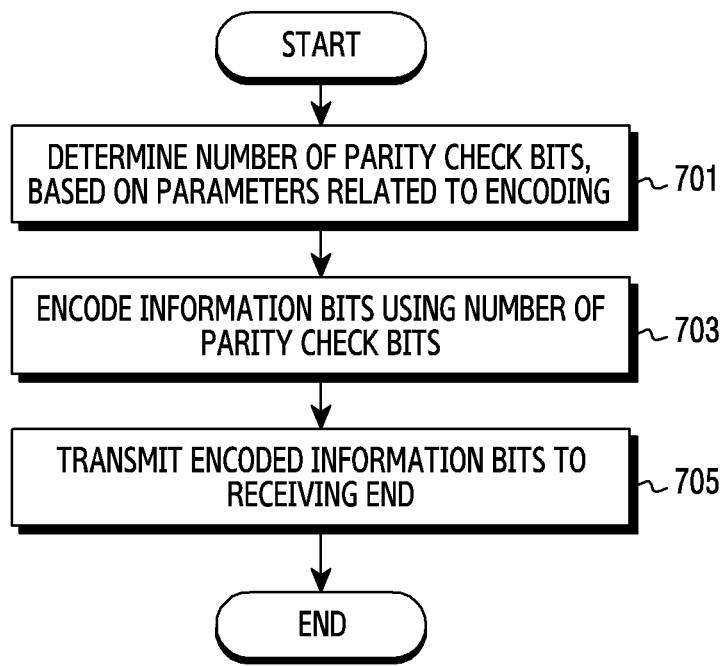
FIG. 7 is a flowchart illustrating an operation of a transmitting apparatus for performing encoding in a wireless communication system according to various embodiments of the disclosure.

FIG. 7 is a flowchart illustrating an operation of a transmitting apparatus for performing encoding in a wireless communication system according to various embodiments of the disclosure. FIG. 7 illustrates a method of operating the transmitting end 110 of FIG. 1.

Referring to FIG. 7, at operation 701, the transmitting end identifies the number of PC bits based on parameters related to encoding of information bits. In some embodiments, the parameters related to encoding of the information bits may include at least one of the number of information bits to be transmitted, the number of codeword bits encoded and transmitted through a channel, the number of bits of the concatenated outer code except for the PC code, the size of the mother code of the polar code, and the maximum number of bits of the PC code. According to various embodiments, the transmitting end may determine the number of PC bits on different references according to whether the receiving end for receiving information bits treats the PC bits as frozen bits.

At operation 703, the transmitting end encodes the information bits according to the number of PC bits. For example, through the concatenated outer code, the transmitting end may perform outer encoding on the information bits to be transmitted. In some embodiments, the concatenated outer code may include an error-detecting code (for example, a CRC code) and an error-correcting code (for example, a PC code). In some embodiments, the transmitting end may determine the concatenated outer code based on the determined number of PC bits and may perform outer encoding on information bits based on the determined concatenated outer code. In some embodiments, the transmitting end may map the outer encoded-information bits to a bit sequence having the size of the mother code of the polar code, multiply the mapped bit sequence by a generator matrix of the polar code, and extract the number of bits corresponding to bits to be transmitted from the bit sequence multiplied by the generator matrix so as to encode the information bits.

At operation 705, the transmitting end transmits the encoded information bits to the receiving end. The encoded information bits may be referred to as packets or codewords. That is, the transmitting end may transmit the encoded information bits through resources allocated for corresponding transmission. For example, the encoded information bits may include uplink or downlink control information.

In the embodiment described with reference to FIG. 7, the transmitting end determines the number of PC bits based on parameters related to encoding (for example, the number of information bits to be transmitted, the number of codeword bits encoded and transmitted through a channel, the number of bits of the concatenated outer code except for the PC code, the size of the mother code of the polar code, and the maximum number of bits of the PC code). However, the number of PC bits may be predefined according to transmitted information. In this case, the transmitting end may determine the number of PC bits through predefined mapping information rather than determining the number of PC bits based on the parameters related to encoding. That is, according to other embodiments, the transmitting end may identify the number of PC bits by searching for the number of PC bits corresponding to information to be transmitted.

Figure 8:
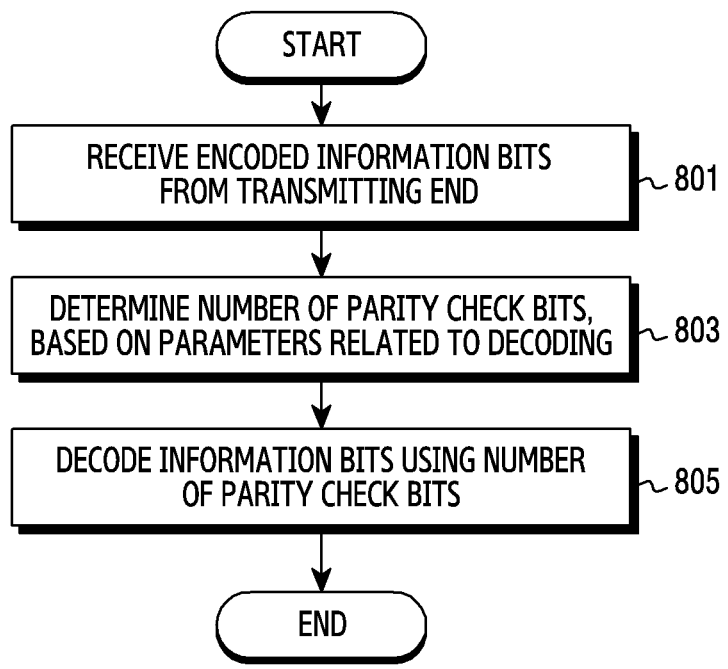
FIG. 8 is a flowchart illustrating an operation of the receiving apparatus for performing decoding in a wireless communication system according to various embodiments of the disclosure.

FIG. 8 is a flowchart illustrating an operation of the receiving apparatus in a wireless communication system according to various embodiments of the disclosure. FIG. 8 illustrates a method of operating the receiving end 120 of FIG. 1.

Referring to FIG. 8, at operation 801, the receiving end receives encoded information bits from the transmitting end. The encoded information bits may be referred to as packets or codewords. That is, the transmitting end may transmit the encoded information bits through resources allocated for corresponding transmission. For example, the encoded information bits may include uplink or downlink control information.

At operation 803, the receiving end identifies the number of PC bits based on parameters related to decoding of the information bits. In some embodiments, the parameters related to decoding of the information bits may include the number of information bits to be received, the number of codeword bits encoded and transmitted through a channel, the number of bits of the concatenated outer code except for the PC code, the size of the mother code of the polar code, and the maximum number of bits of the PC code. According to various embodiments, the receiving end may determine the number of PC bits based on different references according to whether the receiving end treats the PC bits as frozen bits.

At operation 805, the receiving end may decode the information bits according to the number of PC bits. The receiving end may decode the encoded information bits by inversely performing the encoding process performed by the transmitting end. In some embodiments, the receiving end may decode the encoded information bits through the concatenated outer code. In some embodiments, the concatenated outer code may include an error-detecting code (for example, a CRC code) and an error-correcting code (for example, a PC code). In some embodiments, the receiving end may determine the concatenated outer code based on the determined number of PC bits and decode the information bits based on the determined concatenated outer code. In some embodiments, the concatenated outer code may be predetermined and stored in the storage unit 320 of the receiving end.

In the embodiment described with reference to FIG. 8, the receiving end determines the number of PC bits based on the parameters related to encoding (for example, the number of information bits to be transmitted, the number of codeword bits encoded and transmitted through a channel, the number of bits of the concatenated outer code except for the PC code, the size of the mother code of the polar code, and the maximum number of bits of the PC code). However, the number of PC bits may be predefined according to transmitted information. In this case, the receiving end may determine the number of PC bits through predefined mapping information rather than determining the number of PC bits based on the parameters related to encoding. That is, according to another embodiment, the receiving end may identify the number of PC bits by searching for the number of PC bits corresponding to information to be transmitted. In this case, the receiving end may identify the number of PC bits before operation 801.

Figure 9:
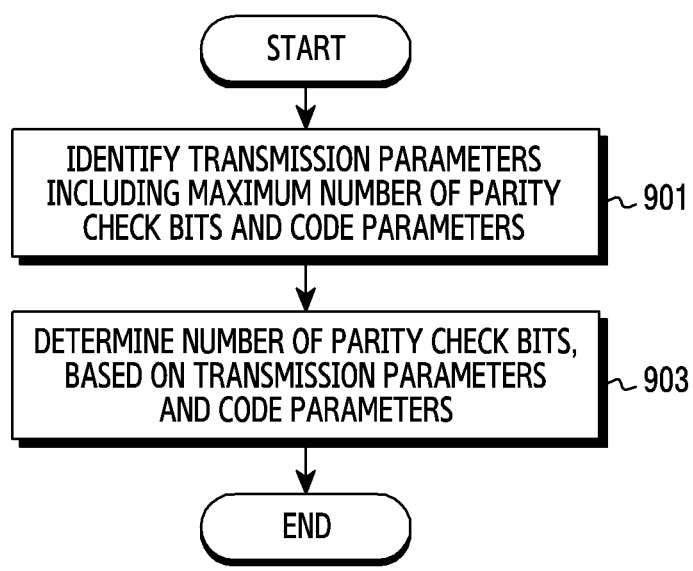
FIG. 9 is a flowchart illustrating an operation of a transmitting apparatus for determining a number of parity check (PC) bits when PC bits are treated as frozen bits in a wireless communication system according to various embodiments of the disclosure.

FIG. 9 is a flowchart illustrating an operation of the transmitting apparatus for determining a number of PC bits when PC bits are treated as frozen bits in a wireless communication system according to various embodiments of the disclosure. FIG. 9 illustrates a method of operating the transmitting end 110 of FIG. 1. However, the following operations may be performed equally by the receiving end 120 of FIG. 1.

Referring to FIG. 9, at operation 901, the transmitting end identifies transmission parameters including a maximum value of the number of PC bits and code parameters. In some embodiments, the transmission parameters may include a maximum value of the number of PC bits, the number of information bits to be transmitted, the number of codeword bits encoded and transmitted through a channel, and the number of bits of the concatenated outer code except for the PC code (for example, CRC bits), and the code parameters may include the size of the mother code for the polar code. In some embodiments, the maximum value of the number of PC bits may be $L_{pc}^{max}$, the number of information bits may be K, the number of codeword bits may be E, the number of bits of the concatenated outer code except for the PC code may be $L_{other}$, and the size of the mother code may be N. The transmitting end may identify transmission parameters and configuration parameters predetermined and stored in the storage unit 220. For the stable and simple operation of the system, the maximum value $L_{pc}^{max}$ of the number of PC bits may be predefined, and $L_{pc}^{max}$ may be changed by a predetermined rule. For example, the maximum value of the number of PC bits may be determined by the length of information word bits, uplink/downlink, a UE category, and UE capacity through higher-layer signaling of radio resource control (RRC) or physical-layer signaling of downlink control information (DCI).

At operation 903, the transmitting end determines the number of PC bits based on the transmission parameters and the code parameters. For example, the transmitting end may identify that the receiving end treats the PC bits as frozen bits and compare a value obtained by subtracting a sum of the number of information bits and the number of bits of the concatenated code except for the PC code from the number of codeword bits with the maximum number of bits of the PC code so as to determine the number of PC bits for encoding the information bits. That is, the number of PC bits may be determined through Equation 3 below.

$$L_{pc}=\min(E-(K+L_{other}),L_{pc}^{max}) \qquad \text{Equation 3}$$

In Equation 3, $L_{pc}$ denotes the number of PC bits, E denotes the number of codeword bits, K denotes the number of information bits, $L_{other}$ denotes the number of bits of the concatenated outer code except for the PC code (for example, the number of CRC bits), and $L_{pc}^{max}$ denotes the maximum value of the number of PC bits. In some embodiments, the value of $E-(K+L_{other})$ indicates the number of remaining sub-channels after information bits and parity bits of another concatenated outer code are mapped in the configuration of the polar code. In order to avoid creating the situation in which the encoding operation is not defined, the transmitting end may make the number of PC bits satisfy $L_{pc} \leq E-(K+L_{other})$. Accordingly, the maximum value of the number of PC bits may be limited to $E-(K+L_{other})$. Therefore, according to various embodiments of the disclosure, after identifying or determining the value of $E-(K+L_{other})$, the transmitting end may determine the number of PC bits through Equation 3 in consideration of the predetermined maximum value L ax of the number of PC bits.

Through the above-described process, in order to avoid the case in which encoding of the polar code using the PC code as the concatenated outer code is not defined, the transmitting end may identify a predetermined condition based on the transmission parameters, determine the number $L_{pc}$ of PC bits according to whether the condition is satisfied, and then perform encoding. The receiving end may decode the encoded information bits according to the determined number of PC bits.

In some embodiments, the parity bits of the PC code are generally treated as frozen bits in the decoding operation of the receiving end but may be treated as unfrozen bits in some operations of the receiving end. For example, in the case of early termination of SC-based decoding using the distributed CRC code or parity bits of the PC code, the receiving end may treat the parity bits of the PC code as frozen bits. Accordingly, when the transmitting end and the receiving end of the polar code using the PC code as the concatenated outer code according to the disclosure consider the decoder treating the parity bits of the PC code as unfrozen bits, the transmitting end and the receiving end may identify a predetermined condition based on transmission parameters, determine the number of PC frozen bits according to the condition, and then perform encoding and decoding. Therefore, FIG. 10 describes an embodiment for determining the number of PC bits when the PC bits are treated as unfrozen bits.

Figure 10:
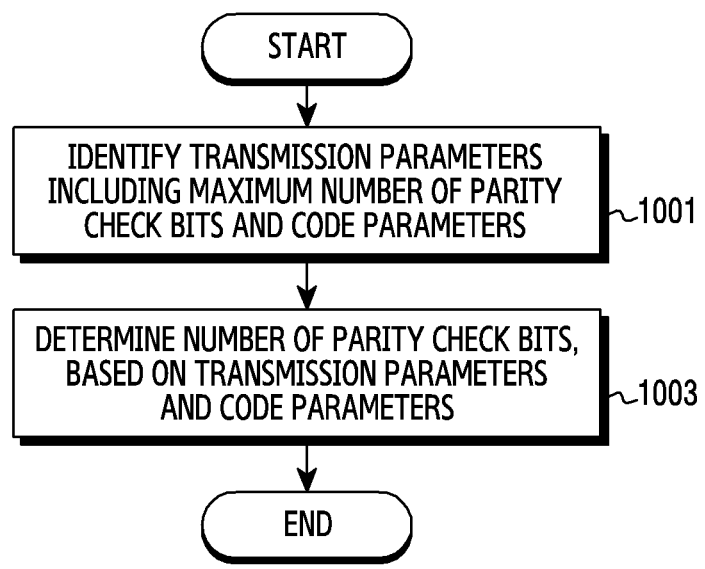
FIG. 10 is a flowchart illustrating an operation of a transmitting end apparatus determining a number of PC bits when PC bits are treated as unfrozen bits in a wireless communication system according to various embodiments of the disclosure.

FIG. 10 is a flowchart illustrating an operation of a transmitting apparatus for determining a number of PC bits when PC bits are treated as unfrozen bits in a wireless communication system according to various embodiments of the disclosure. FIG. 10 illustrates a method of operating the transmitting end 110 of FIG. 1. However, the following operations may be performed equally for the receiving end 120 of FIG. 1.

Referring to FIG. 10, at operation 1001, the transmitting end identifies predetermined transmission parameters including a maximum value of the number of PC bits and code parameters.

In some embodiments, the predetermined transmission parameters may include a maximum value of the number of PC bits, the number of information bits to be transmitted, the number of codeword bits polar-encoded and transmitted through a channel, and the number of bits of the concatenated outer code except for the PC code (for example, CRC bits), and the code parameters may include the size of the mother code for the polar code. In some embodiments, the maximum value of the number of PC bits may be $L_{pc}^{max}$, the number of information bits may be K, the number of codeword bits may be E, the number of bits of the concatenated outer code except for the PC code may be $L_{other}$, and the size of the mother code may be N. The transmitting end may identify transmission parameters and configuration parameters predetermined and stored in the storage unit 220. The maximum value $L_{pc}^{max}$ of the number of PC bits may be predetermined for the stable and simple operation of the system.

At operation 1003, the transmitting end may determine the number of PC bits based on the transmission parameters and the code parameters. For example, the transmitting end may identify that the receiving end treats the PC bits as unfrozen bits and compare a value, obtained by subtracting 1 from a value obtained by subtracting a sum of the number of information bits and the number of bits of the concatenated code except for the PC code from the number of codeword bits, with the maximum number of bits of the PC code so as to determine the number of PC bits for encoding the information bits. That is, the number of PC bits may be determined through Equation 4 below.

$$L_{pc}=\min(E-(K+L_{other})-1,L_{pc}^{max}) \qquad \text{Equation 4}$$

In Equation 4, $L_{pc}$ denotes the number of PC bits, E denotes the number of codeword bits, K denotes the number of information bits, $L_{other}$ denotes the number of bits of the concatenated outer code except for the PC code (for example, the number of CRC bits), and $L_{pc}^{max}$ denotes the maximum value of the number of PC bits. In some embodiments, a value of $E-(K+L_{other})$ indicates the number of remaining sub-channels after information bits and parity bits of another concatenated outer code are mapped in the configuration of the code.

The transmitter may make the number of PC bits satisfy $L_{pc}<E-(K+L_{other})$ in order to prevent a code rate $R=(K+L_{pc}+L_{other})/E$ from being greater than or equal to 1 in consideration of the situation in which the PC bits are treated as the unfrozen bits by the decoder of the receiving end. Accordingly, the maximum value of the number of PC bits may be limited to $E-(K+L_{other})-1$. Therefore, after identifying or determining the value of $E-(K+L_{other})$, the transmitting end according to the disclosure may determine the number of PC bits through Equation 4 in consideration of the predetermined maximum value $L_{pc}^{max}$ of the number of PC bits.

The PC-CA polar code may be considered as an embodiment of FIGS. 9 and 10. The CA-PC polar code may be used when the number of information bits, including 6 CRC bits, is larger than or equal to 18 and smaller than or equal to 25, and at this time, a highest degree of the mother code may be determined as 10 and the number $L_{pc}$ of PC bits may be determined as 3.

For the operation of the CA-PC polar code as illustrated in FIG. 9, the number $n_{pc}$ of PC frozen bits is not unconditionally determined to be 3; rather, the number of remaining sub-channels may be considered. The transmitting end may fix the maximum value $L_{pc}^{max}$ of the number of PC frozen bits to 3, but if the number of remaining sub-channels is smaller than $L_{pc}^{max}$, the transmitting end may adjust the value. Accordingly, when the embodiment illustrated in FIG. 9 is reflected, the operation of the CA-PC polar code may be defined as shown in Table 1 below.

TABLE 1

The information bits are encoded via Polar coding, by setting $n_{max}=10$, $I_{IL}=0$, $n_{pc}=\min(E_r+K_r,3)$, $n_{PC}^{wm}=1$ if $E_r-K_r+3>192$ and $n_{PC}^{wm}=0$ if $E_r-K_r+3\leq192$, where $E_r$ is the rate matching output sequence length.

In Table 1, $K_r$ is the length of polar code input bits of an $r^{th}$ segment or code block and indicated by a sum of the number of information bits and the number of CRC parity bits, and corresponds to the sum $K+L_{other}$ of the number of information bits and the number of CRC bits described above. Further, in Table 1, $n_{pc}$ corresponds to the number $L_{pc}$ of PC bits described above. $n_{PC}^{wm}$ is the number of other PC bits.

For the operation of the CA-PC polar code as illustrated in FIG. 10, the number $n_{pc}$ of PC frozen bits is not unconditionally determined as 3; rather, the code rate considering the PC frozen bits as unfrozen bits may be considered. Accordingly, when the embodiment illustrated in FIG. 10 is reflected, the operation of the CA-PC polar code may be defined as shown in Table 2.

TABLE 2

The information bits are encoded via Polar coding, by setting $n_{max}=10$, $I_{IL}=0$, $n_{pc}=\min(E_r-K_r-1,3)$, $n_{PC}^{wm}=1$ if $E_r-K_r+3>192$ and $n_{PC}^{wm}=0$ if $E_r-K_r+3\leq192$, where $E_r$ is the rate matching output sequence length.

In Table 2, $K_r$ is the length of polar code input bits of an $r^{th}$ segment or code block and is indicated by a sum of the number of information bits and the number of CRC parity bits, which is 6 bits, and corresponds to the sum $K+L_{other}$ of the number of information bits and the number of CRC bits described above. Further, in Table 2, $n_{pc}$ corresponds to the number $L_{pc}$ of PC bits described above. $n_{PC}^{wm}$ is the number of other PC bits.

Through the various embodiments, the transmitting end and the receiving end may efficiently perform encoding and decoding by controlling the number of PC bits. Hereinafter, the disclosure describes other embodiments for controlling the number of information bits as well as the number of PC bits or controlling whether to transmit information based on selective transmission with reference to FIGS. 11 to 14.

Figure 11:
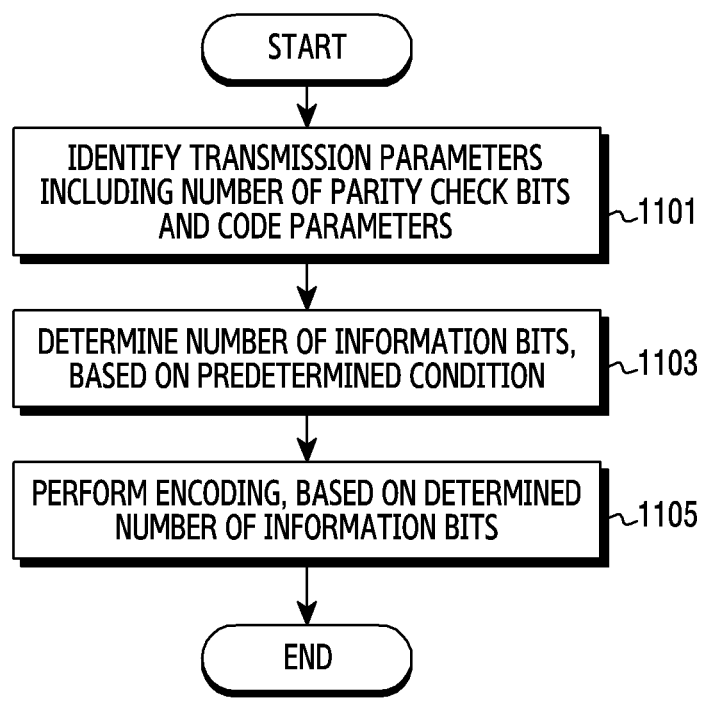
FIG. 11 is a flowchart illustrating an operation of a transmitting apparatus for performing encoding based on control of a number of information bits in a wireless communication system according to various embodiments of the disclosure.

FIG. 11 is a flowchart illustrating an operation of a transmitting apparatus for performing encoding based on control of a number of information bits in a wireless communication system according to various embodiments of the disclosure. FIG. 11 illustrates a method of operating the transmitting end 110 of FIG. 1.

Referring to FIG. 11, at operation 1101, the transmitting end identifies transmission parameters including the number of PC bits and code parameters. In some embodiments, the transmission parameters may include the number of PC bits, the number of all information bits to be transmitted, the number of codeword bits polar-encoded and transmitted through a channel, and the number of bits of the concatenated outer code except for the PC code (for example, CRC bits), and the code parameters may include the size of the mother code for the polar code. In some embodiments, the number of PC bits may be $L_{pc}$, the number of all information bits to be transmitted may be $K_{max}$, the number of codeword bits may be E, the number of bits of the concatenated outer code except for the PC code may be $L_{other}$, and the size of the mother code may be N. The transmitting end may identify transmission parameters and configuration parameters predetermined and stored in the storage unit 220. For example, the number of PC bits may be predetermined for stable and simple operation of the system.

At operation 1103, the transmitting end determines the number of information bits based on predetermined conditions. For example, the transmitting end may determine the number K of information bits to be transmitted by identifying whether encoding of the polar code including the PC bits is defined based on the parameters (for example, the length $K_{max}$ of all information bits to be transmitted, the lengths $L_{pc}$ and $L_{other}$ of parity bits of the concatenated outer code, the length E of codeword bits, and the size N of the mother code) identified at operation 1101. In some embodiments, all information bits may include two or more fields according to the type thereof. In some embodiments, the reference for defining encoding may vary depending on whether the decoder of the receiving end treats the PC bits as frozen bits or unfrozen bits. That is, when the PC bits are treated as frozen bits, if the number of PC bits is larger than a value obtained by subtracting a sum of the number of information bits and the number of CRC bits from the number of codeword bits (that is, $L_{pc}>E-(K+L_{other})$), encoding of the transmitting end may not be defined. When the PC bits are treated as unfrozen bits, if the number of PC bits is larger than or equal to a value obtained by subtracting a sum of the number of information bits and the number of CRC bits from the number of codeword bits (that is, $L_{pc}>E-(K+L_{other})$), encoding may not be defined.

Accordingly, in order to define the encoding, the transmitting end may make the number of information bits satisfy a condition (that is, $L_{pc}<E-(K+L_{other})$) in which the number of information bits to be transmitted is equal to or smaller than the length of all information bits and the number of PC bits is smaller than the value obtained by subtracting the sum of the number of information bits and the number of CRC bits from the number of codeword bits or a condition (that is, $L_{pc}\leq E-(K+L_{other})$) in which the number of PC bits is equal to or smaller than the value obtained by subtracting the sum of the number of information bits and the number of CRC bits from the number of codeword bits. That is, among all of the $K_{max}$ information bits to be transmitted, only K bits may be transmitted, and when the transmitting end determines some bits, the features of each field, importance, and urgency included in all information bits to be transmitted may be considered.

At operation 1105, the transmitting end performs encoding based on the determined number of information bits. That is, since the encoding may be defined through the process, the transmitting end may perform encoding based on the determined number of information bits.

Figure 12:
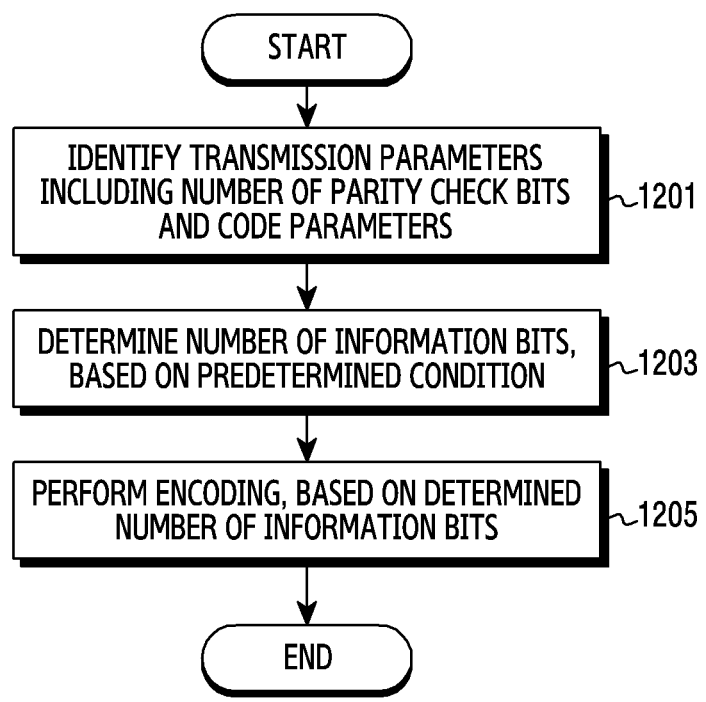
FIG. 12 is a flowchart illustrating an operation of a receiving apparatus for performing decoding based on control of a number of information bits in a wireless communication system according to various embodiments of the disclosure.

FIG. 12 is a flowchart illustrating an operation of a receiving apparatus for performing decoding based on control of a number of information bits in a wireless communication system according to various embodiments of the disclosure. FIG. 12 illustrates a method of operating the receiving end 120 of FIG. 1.

Referring to FIG. 12, at operation 1201, the receiving end identifies transmission parameters including the number of PC bits and code parameters. In some embodiments, the transmission parameters may include the number of PC bits, the number of all information bits to be received, the number of codeword bits received through a channel, and the number of bits (for example, CRC bits) of the concatenated outer code except for the PC code, and the code parameters may include the size of the mother code of the polar code. In some embodiments, the number of PC bits may be $L_{pc}$, the number of all information bits to be received may be $K_{max}$, the number of codeword bits may be E, the number of bits of the concatenated code except for the PC code may be $L_{other}$, and the size of the mother code may be N. The transmitting end may identify transmission parameters and configuration parameters predetermined and stored in the storage unit 220. The number of PC bits may be predetermined for stable and simple operation of the system.

At operation 1203, the receiving end determines the number of information bits based on a predetermined condition. For example, the receiving end may determine the number K of information bits to be transmitted by identifying whether encoding of the polar code including the PC bits is defined based on the parameters (for example, the length $K_{max}$ of all information bits to be received, the lengths $L_{pc}$ and $L_{other}$ of parity bits of the concatenated outer code, the length E of codeword bits, and the size N of the mother code) identified at operation 1201. In some embodiments, all information bits may include two or more fields according to the type thereof. In some embodiments, the reference for defining encoding may vary depending on whether the decoder of the receiving end treats the PC bits as frozen bits or unfrozen bits. That is, when the PC bits are treated as frozen bits, if the number of PC bits is larger than a value obtained by subtracting the sum of the number of information bits and the number of CRC bits from the number of codeword bits (that is, $L_{pc}>E-(K+L_{other})$), encoding of the transmitting end may not be defined. When the PC bits are treated as unfrozen bits, if the number of PC bits is larger than or equal to a value obtained by subtracting the sum of the number of information bits and the number of CRC bits from the number of codeword bits (that is, $L_{pc}>E-(K+L_{other})$), encoding may not be defined.

Accordingly, in order to define the encoding, the transmitting end may make the number of information bits satisfy a condition (that is, $L_{pc}<E-(K+L_{other})$) in which the number of information bits to be transmitted is equal to or smaller than the length of all information bits and the number of PC bits is smaller than the value obtained by subtracting the sum of the number of information bits and the number of CRC bits from the number of codeword bits or a condition (that is, $L_{pc}\leq E-(K+L_{other})$) in which the number of PC bits is equal to or smaller than the value obtained by subtracting the sum of the number of information bits and the number of CRC bits from the number of codeword bits. That is, among all of the $K_{max}$ information bits to be received, only K bits may be received, and when the receiving end determines some bits, the features of each field, importance, and urgency included in all information bits to be received may be considered.

At operation 1205, the receiving end performs decoding based on the determined number of information bits. That is, since the receiving end can perform decoding through the process, the decoding may be performed based on the determined number of information bits.

Figure 13:
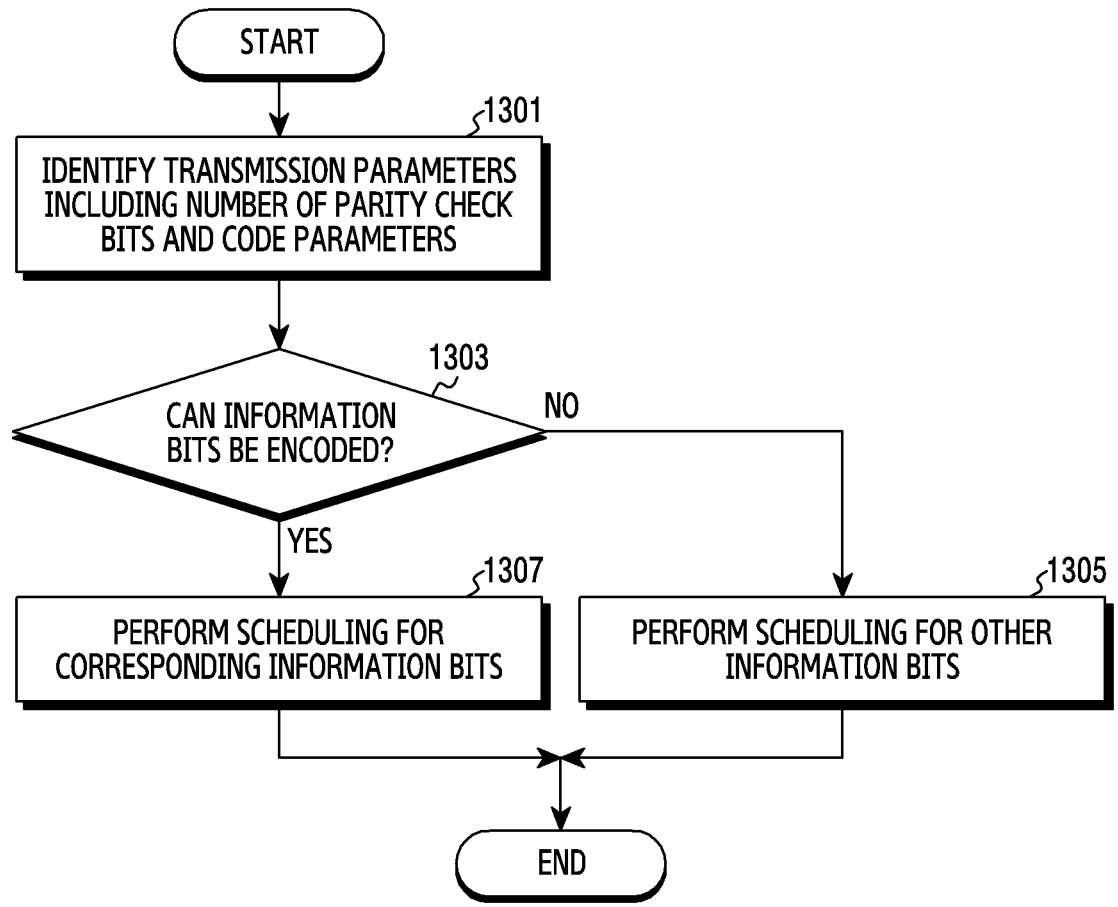
FIG. 13 is a flowchart illustrating an operation of a base station (BS) for performing scheduling based on whether encoding can be performed in a wireless communication system according to various embodiments of the disclosure.

FIG. 13 is a flowchart illustrating an operation of a BS for performing scheduling based on whether encoding can be performed in a wireless communication system according to various embodiments of the disclosure. FIG. 13 illustrates a method of operating the BS. In some embodiments, the BS of FIG. 13 may be the transmitting end 110 or the receiving end 120 of FIG. 1.

Referring to FIG. 13, at operation 1301, the BS identifies transmission parameters including the number of PC bits and code parameters. In some embodiments, the transmission parameters may include the number of PC bits, the number of information bits to be transmitted, the number of codeword bits to be transmitted through a channel, and the number of bits (for example, CRC bits) of the concatenated outer code except for the PC code, and the code parameters may include the size of the mother code for the polar code. In some embodiments, the number of PC bits may be $L_{pc}$, the number of information bits to be transmitted may be K, the number of codeword bits may be E, the number of bits of the concatenated outer code except for the PC code may be $L_{other}$, and the size of the mother code may be N. The BS may identify transmission parameters and configuration parameters predetermined and stored in the storage unit 220 or the storage unit 320. For example, the number of PC bits may be predetermined for stable and simple operation of the system.

At operation 1303, the BS determines whether encoding for information bits can be performed. In other words, the BS determines whether encoding for information bits is defined based on parameters. That is, the BS may determine whether encoding of the polar code including PC bits can be performed based on the identified transmission parameters and code parameters. In some embodiments, the reference for determining whether encoding can be performed may vary depending on whether the decoder of the receiving end treats the PC bits as frozen bits or as unfrozen bits. For example, when the PC bits are treated as frozen bits, if the number of PC bits is larger than a value obtained by subtracting the sum of the number of information bits and the number of CRC bits from the number of codeword bits (that is, $L_{pc}>E-(K+L_{other})$), encoding of the BS may not be defined. When the PC bits are treated as unfrozen bits, if the number of PC bits is larger than or equal to a value obtained by subtracting the sum of the number of information bits and the number of CRC bits from the number of codeword bits (that is, $L_{pc}\geq E-(K+L_{other})$), encoding of the BS may not be defined.

When the BS determines that encoding for the information bits cannot be performed, the BS may perform scheduling for other information bits at operation 1305. For example, when encoding of the polar code including the PC bits cannot be performed, the BS may not schedule resources for transmitting the corresponding information bits. At this time, scheduling for other messages may be performed. In some embodiments, the BS may wait for scheduling for the corresponding information bits and perform scheduling for other messages. In some embodiments, when scheduling for the corresponding information bits is not performed, the BS may allocate more resources or perform scheduling at the time point of the next scheduling at which better channel quality is secured.

When the BS determines that encoding for the information bits can be performed, the BS schedules the corresponding information bits at operation 1307. That is, when encoding of the polar code including the PC bits can be performed, the BS may perform encoding on information bits and perform scheduling for transmitting the corresponding information.

In connection with the scheduling of FIG. 13, downlink and uplink situations are described below. In some embodiments, in the case of downlink, the transmitting end is the BS and the receiving end is the terminal. When the BS first determines the possibility of encoding before scheduling, the BS may not perform scheduling for transmitting information to the UE. In this case, the terminal does not receive information. However, even though the BS does not first perform scheduling, the BS may identify that encoding is not defined and may not transmit information without performing encoding. In this case, the terminal does not receive information in spite of scheduling by the BS. In some embodiments, in the case of uplink, the transmitting end is the terminal and the receiving end is the BS. At this time, when the terminal determines that encoding is not defined, the terminal may not perform encoding and may not transmit information. In this case, the BS does not receive information.

Figure 14A:
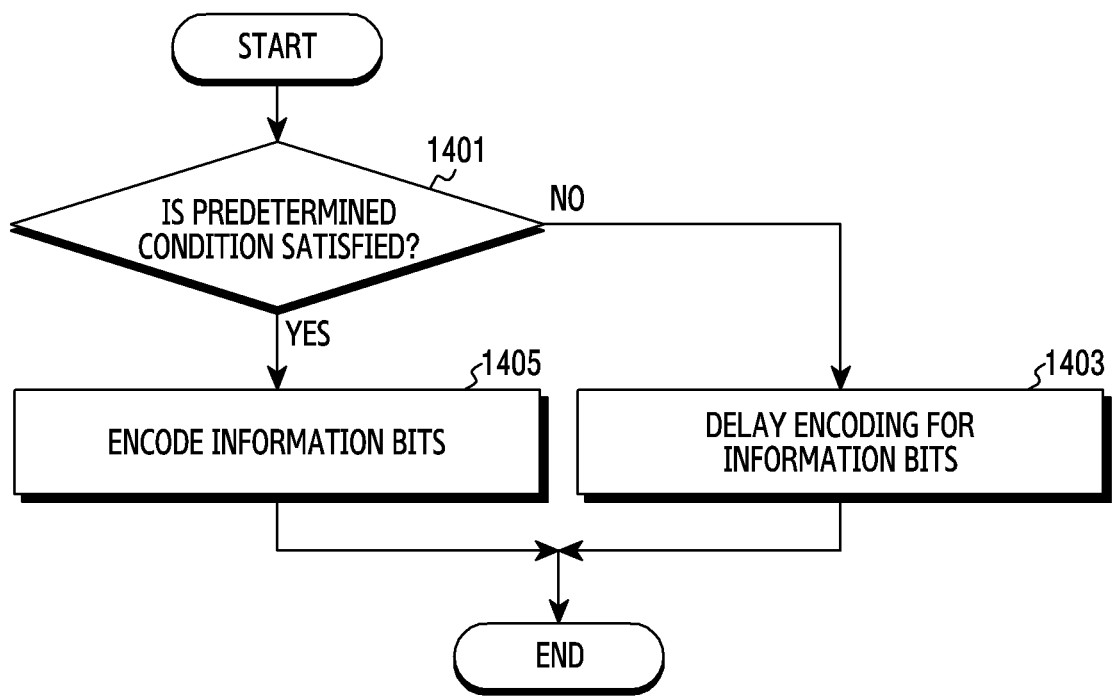
FIG. 14A is a flowchart illustrating an operation of a transmitting apparatus for performing encoding based on whether a predetermined condition is satisfied in a wireless communication system according to various embodiments of the disclosure.

FIG. 14A is a flowchart illustrating an operation of the transmitting apparatus for performing encoding based on whether a predetermined condition is satisfied in a wireless communication system according to various embodiments of the disclosure.

FIG. 14A illustrates a method of operating the transmitting end 110 of FIG. 1. In some embodiments, FIG. 14A illustrates a method of operating the transmitting end when the transmitting end performs scheduling before determining whether encoding is possible.

Referring to FIG. 14A, at operation 1401, the transmitting end determines whether a predetermined condition is satisfied. That is, the transmitting end may check the predetermined condition in order to guarantee that the encoding operation is possible. The predetermined condition may be expressed by the relationship between encoding-enabling parameters. In some embodiments, the predetermined condition may vary depending on whether the PC bits are treated as frozen bits or unfrozen bits. For example, when the PC bits are treated as frozen bits, the predetermined condition may include cases other than the case in which the number of PC bits is larger than a value obtained by subtracting the sum of the number of information bits and the number of CRC bits from the number of codeword bits (that is, $L_{pc} > E-(K+L_{other})$). When the PC bits are treated as unfrozen bits, the predetermined condition may include cases other than the case in which the number of PC bits is larger than or equal to a value obtained by subtracting the sum of the number of information bits and the number of CRC bits from the number of codeword bits (that is, $Lp \geq E-(K+L_{other})$). In order to guarantee that the encoding operation is possible, the transmitting end may determine values of encoding-enabling parameters such that the predetermined condition is satisfied. For example, the predetermined condition may be expressed as shown in Table 3 and Table 4 below.

TABLE 3

UE and gNB may assume $E-(K+L_{other})$ is greater than $L_{pc}$

In Table 3, E denotes the number of codeword bits, K denotes the number of information bits, $L_{other}$ denotes the number of bits (for example, the number of CRC bits) of the concatenated outer code except for the PC code, and $L_{pc}$ denotes the number of PC bits.

TABLE 4

UE and gNB may assume $E-(K+L_{other})$ is greater than or equal to $L_{pc}$

In Table 4, E denotes the number of codeword bits, K denotes the number of information bits, $L_{other}$ denotes the number of bits (for example, the number of CRC bits) of the concatenated outer code except for the PC code, and $L_{pc}$ denotes the number of PC bits.

When the predetermined condition is not satisfied, the transmitting end may delay encoding for the information bits at operation 1403. That is, when the predetermined condition is not satisfied at operation 1401, the transmitting end may perform a separate process. For example, the transmitting end may not perform the encoding operation for the information bits. In some embodiments, the transmitting end may directly transmit information bits without performing the encoding operation for the information bits, or may transmit bits which are irrelevant to the information bits. Further, the transmitting end may store a preset value related to information bits without performing the encoding operation for the information bits, thereby delaying the encoding operation for the corresponding information bits.

When the predetermined condition is satisfied, the transmitting end performs encoding for the information bits at operation 1405. That is, since the transmitting end can encode the information bits, the transmitting end may encode the information bits to be transmitted and transmit the encoded information bits to the receiving end.

Figure 14B:
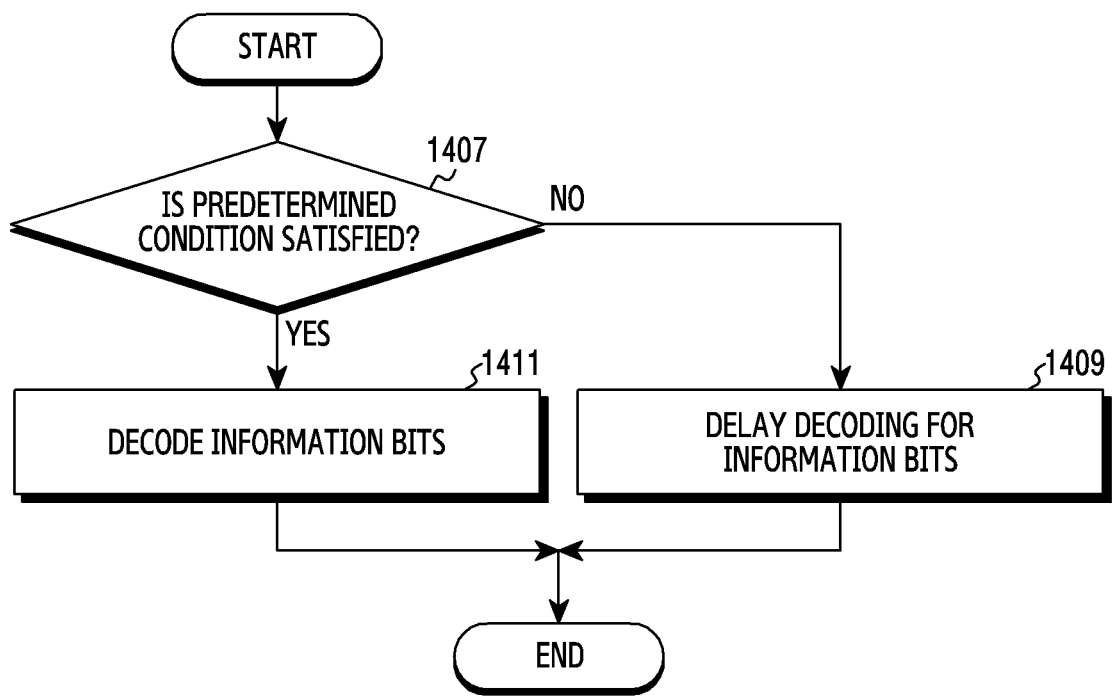
FIG. 14B is a flowchart illustrating an operation of a receiving apparatus for performing decoding based on whether a predetermined condition is satisfied in a wireless communication system according to various embodiments of the disclosure.

FIG. 14B is a flowchart illustrating an operation of the receiving apparatus for performing decoding based on whether a predetermined condition is satisfied in a wireless communication system according to various embodiments of the disclosure. FIG. 14B illustrates a method of operating the receiving end 120 of FIG. 1 when scheduling is performed before the receiving end determines whether encoding is possible in some embodiments.

Referring to FIG. 14B, at operation 1407, the receiving end determines whether a predetermined condition is satisfied. That is, the receiving end may check the predetermined condition in order to guarantee that the decoding operation is possible. The predetermined condition may be expressed by the relationship between encoding-enabling parameters. In some embodiments, the predetermined condition may vary depending on whether the PC bits are treated as frozen bits or unfrozen bits. For example, when the PC bits are treated as frozen bits, the predetermined condition may include cases other than the case in which the number of PC bits is larger than a value obtained by subtracting the sum of the number of information bits and the number of CRC bits from the number of codeword bits (that is, $L_{pc} > E-(K+L_{other})$). When the PC bits are treated as unfrozen bits, the predetermined condition may include cases other than the case in which the number of PC bits is larger than or equal to a value obtained by subtracting the sum of the number of information bits and the number of CRC bits from the number of codeword bits (that is, $L_{pc}$>E−(K+$L_{other}$)). In order to guarantee that the decoding operation is possible, the receiving end may set the values of decoding-enabling parameters such that the predetermined condition is satisfied. For example, the predetermined condition is as shown in Table 3 and Table 4.

When the predetermined condition is not satisfied, the receiving end may delay decoding for the information bits at operation 1409. That is, when the predetermined condition is not satisfied at operation 1407, the receiving end may perform a separate process. For example, the receiving end may not perform the decoding operation for the information bits. In some embodiments, even though the receiving end receives a signal from the transmitting end, the receiving end may not perform the decoding operation therefor. Further, the receiving end may store a preset value related to information bits without performing the decoding operation for the information bits, thereby delaying the decoding operation for the corresponding information bits.

When the predetermined condition is satisfied, the receiving end performs decoding at operation 1411. That is, since the receiving end can decode the information bits, the receiving end may decode the received information bits and extract data.

Figure 15:
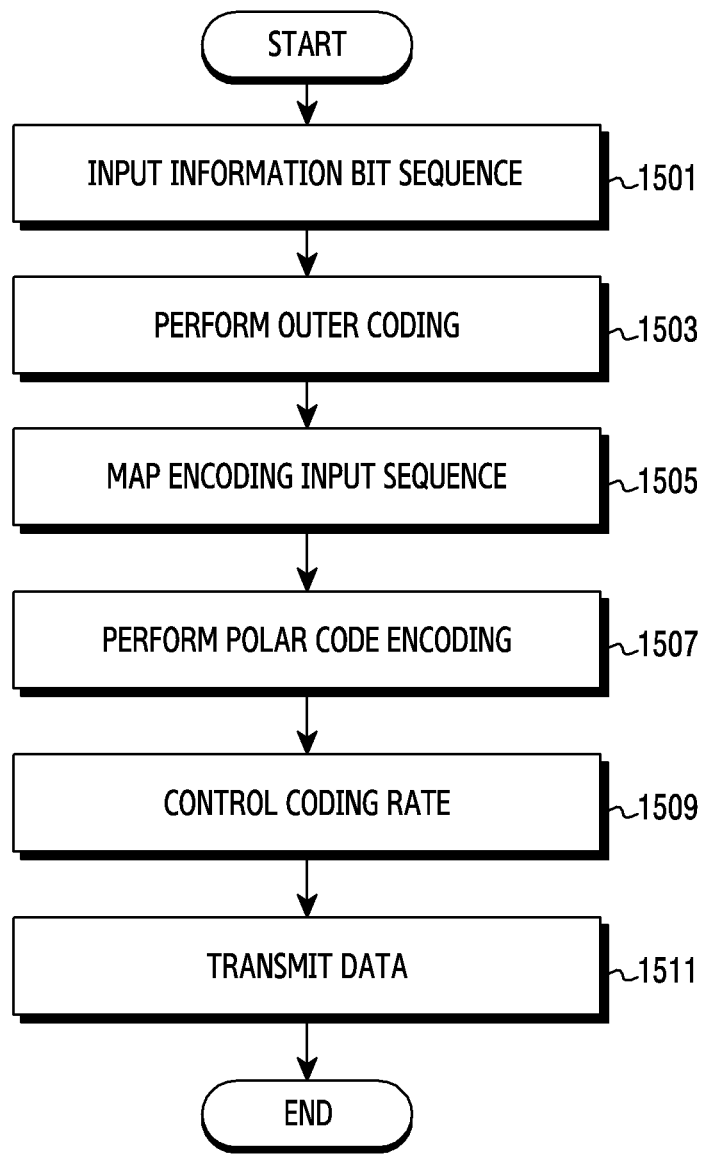
FIG. 15 is a flowchart illustrating an operation of the transmitting apparatus for performing decoding using a polar code in a wireless communication system according to various embodiments of the disclosure.
Figure 16:
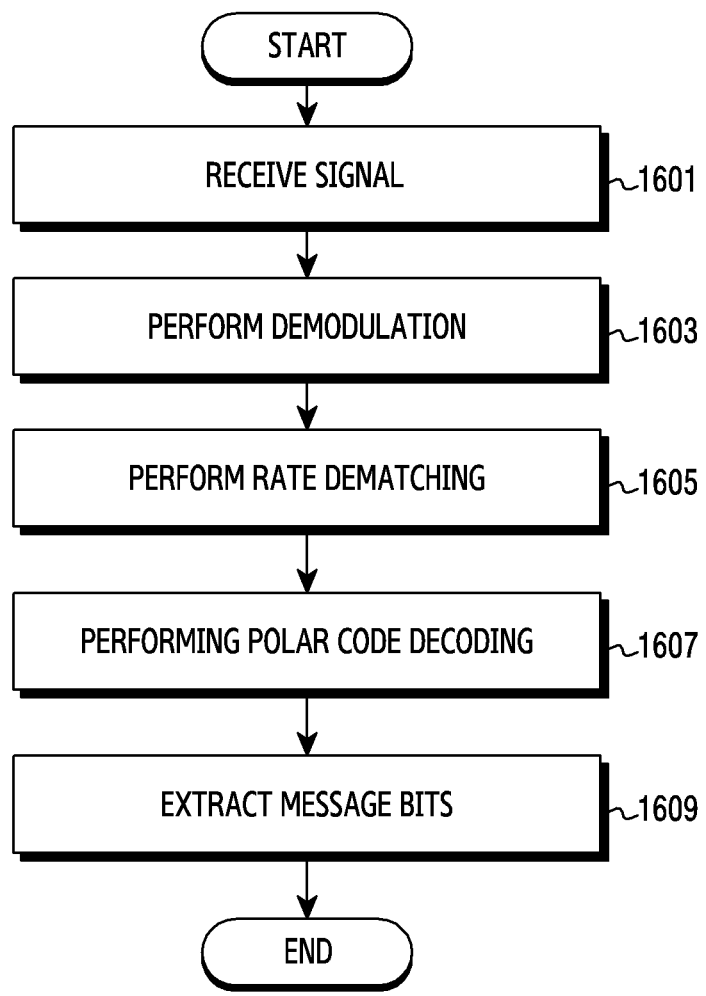
FIG. 16 is a flowchart illustrating an operation of a receiving apparatus for performing decoding using a polar code in a wireless communication system according to various embodiments of the disclosure.

Embodiments for adjusting the number of information bits or controlling whether to transmit information based on whether the predetermined condition is satisfied have been described with reference to FIGS. 11 to 14. FIGS. 15 and 16 illustrate a transmission process of the transmitting end and a reception process of the receiving end according to the disclosure.

FIG. 15 is a flowchart illustrating an operation of the transmitting apparatus for performing decoding using a polar code in a wireless communication system according to various embodiments of the disclosure. FIG. 15 illustrates a method of operating the transmitting end 110 of FIG. 1. Operations 1503 to 1509 of FIG. 15 described below correspond to the operations performed by the devices illustrated FIG. 4.

Referring to FIG. 15, at operation 1501, the transmitting end inputs an information bit sequence. In some embodiments, the information bit sequence is the part of all pieces of information to be transmitted, and may be referred to as a segment.

At operation 1503, the transmitting end performs outer coding. That is, the transmitting end may encode the input bit sequence in order to increase the performance of an ML-like decoder. In some embodiments, the outer code used for outer coding may include an error-detecting code or a BCH code such as a CRC code and an error-correcting code such as a PC code. In some embodiments, the outer coding process may be omitted depending on the performance and type of the system.

At operation 1505, the transmitting end performs encoding input sequence mapping. For example, the transmitting end may map the information bit sequence to the encoding input bit sequence based on the number of information bits, a particular sub-channel order based on the characteristic of the sub-channel of the polar code, the number of transmission bits, and a code rate control method.

At operation 1507, the transmitting end encodes the polar code. That is, the transmitting end may encode the polar code based on the encoding input bit sequence to which the information bit sequence is mapped. In some embodiments, encoding of the polar code may be performed by multiplying the encoding input bit sequence and the generator matrix.

At operation 1509, the transmitting end performs rate matching. For example, the transmitting end may perform rate matching by performing puncturing, shortening, or repetition based on the number of information bits and the number of transmission bits.

At operation 1511, the transmitting end transmits data. That is, the transmitting end may modulate a bit sequence of which a code rate is adjusted to the receiving end.

In an embodiment, the transmitting end is a terminal. For example, the data may include uplink control information. In this case, the terminal receives downlink control information for allocating resource for transmitting the uplink control information, and then transmits the uplink control information according to operations in FIG. 15. Since the terminal is configured or operated by a control of the BS, an operation of the receiving the downlink control information is obviously derived from an operation of the transmitting the uplink control information.

In another embodiment, the transmitting end is a BS. For example, the data may include downlink control information or broadcast information.

FIG. 16 is a flowchart illustrating an operation of a receiving apparatus for performing decoding using a polar code in a wireless communication system according to various embodiments of the disclosure. Operations 1603 to 1607 of FIG. 16 described below correspond to the operations performed by the devices illustrated in FIG. 5.

FIG. 16 illustrates a method of operating the receiving end 120 of FIG. 1.

Referring to FIG. 16, at operation 1601, the receiving end receives a signal. That is, the receiving end may receive encoded signals from the transmitting end through a channel.

At operation 1603, the receiving end performs demodulation. In some embodiments, the receiving end may demodulate the received signal and determine an LLR, which is a log ratio between a probability of 0 of a bit value transmitted by the transmitting end and a probability of 1 of the bit value based on the received signal.

At operation 1605, the receiving end performs rate dematching. That is, the receiving end may inversely perform the rate-matching process performed by the transmitter before performing the polar code decoding. For example, the receiving end may determine an LLR value corresponding to relevant bits according to the puncturing, shortening, or repetition scheme determined based on the number of input bits and the number of transmission bits.

At operation 1607, the receiving end performs polar code decoding. For example, the receiving end may output an estimated value for the encoding input bit sequence through SC-based decoding based on the LLR value determined through the rate dematching process. In some embodiments, the SC-based decoding scheme may include SC-list and SC-stack decoding schemes.

At operation 1609, the receiving end extracts message bits. For example, the receiving end may extract message bits at the predetermined location from the estimated value of the encoding input bit sequence output through the polar code decoding.

In an embodiment, the receiving end is a BS. For example, the data may include uplink control information. In this case, the BS transmits downlink control information for allocating resource for transmitting the uplink control information, and then obtains the uplink control information according to operations in FIG. 16. Since the terminal is configured or operated by a control of the BS, an operation of the receiving the downlink control information is obviously derived from an operation of the transmitting the uplink control information.

Figure 17:
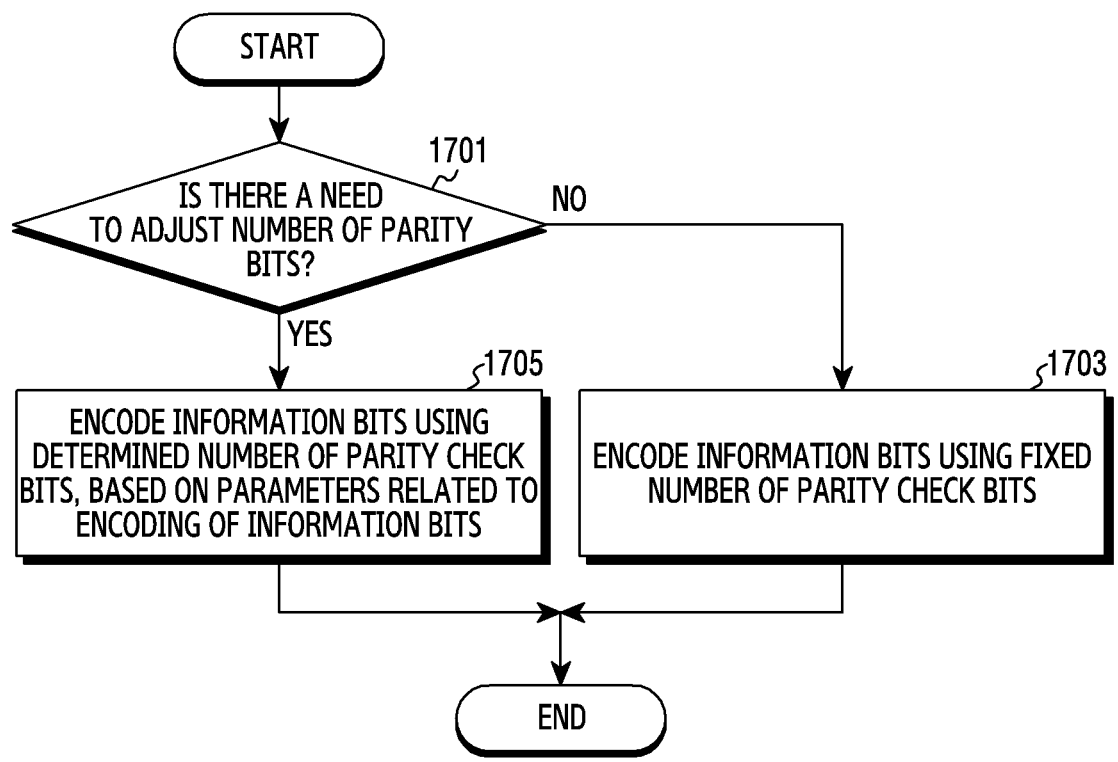
FIG. 17 is a flowchart illustrating an operation of a transmitting apparatus for encoding information bits according to whether there is a need to adjust a number of parity bits in a wireless communication system according to various embodiments of the disclosure.

FIG. 17 is a flowchart illustrating an operation of a transmitting apparatus for encoding information bits depending on whether there is a need to adjust a number of parity bits in a wireless communication system according to various embodiments of the disclosure. FIG. 17 illustrates a method of operating the transmitting end 110 of FIG. 1.

Referring to FIG. 17, at operation 1701, the transmitting end determines whether it is required to adjust the number of parity bits. For example, when a predetermined number of parity bits of the PC code are used, if numbers of information bits and parity bits of the whole concatenated outer code exceed the size of codewords to be transmitted, it is required to adjust the number of parity bits of the PC code. For example, when the parity bits of the PC code are predefined as 3, if the total number of information bits, parity bits of the CRC code, and 3 predefined PC code parity bits is larger than the number of codeword bits to be transmitted, the transmitting end may determine to adjust the number of parity bits. For example, when the number of parity bits of the PC code is set to 3, if the total number of information bits, parity bits of the CRC code, and the 3 predefined PC code parity bits is larger than or equal to the number of codeword bits to be transmitted, the transmitting end may determine to adjust the number of parity bits.

When the transmitting end does not need to adjust the number of parity bits, the transmitting end encodes information bits according to the fixed number of PC bits at operation 1703. In some embodiments, the transmitting end may encode the information bits using the concatenated outer code predetermined according to the fixed number of PC bits. In some embodiments, the concatenated outer code may include an error-detecting code (for example, a CRC code) and an error-correcting code (for example, a PC code).

When the transmitting end needs to adjust the number of parity bits, the transmitting end encodes information bits according to the number of PC bits determined based on parameters related to encoding of the information bits at operation 1705. That is, the transmitting end may determine the number of PC bits based on the parameters related to encoding and generate codewords including the determined number of parity bits. Specifically, the transmitting end may map outer-coded information bits to a bit sequence having the size of the mother code of the polar code, multiply the mapped bit sequence and the generator matrix of the polar code, and extract bits corresponding to the number of bits to be transmitted from the bit sequence multiplied by the generator matrix so as to encode the information bits. For example, the transmitting end may perform encoding in consideration of variability of the number of parity bits according to the various embodiments (the embodiment of FIG. 7, the embodiment of FIG. 9, and the embodiment of FIG. 10).

According to the embodiment of FIG. 15, when the given condition is satisfied, the transmitting end may perform decoding in consideration of variability of the number of parity bits. That is, the transmitting end may use satisfaction of the given condition as a triggering requirement of the encoding procedure considering variability of the number of parity bits. Similarly, the transmitting end may trigger a procedure of adjusting the number of information bits or determining whether to transmit information according to whether the given condition is satisfied.

Similar to the operation of the transmitting end, the receiving end may decode information bits according to whether there is a need to adjust the number of parity bits.

Referring to the description made with reference to FIGS. 1 to 17, when encoding and decoding of the polar code are performed using the concatenated outer code including PC bits, an apparatus and a method according to various embodiments of the disclosure can change a particular parameter to define encoding and decoding of the transmitting end and the receiving end.

That aforementioned encoding procedure may be performed as below. In descriptions below, a device performing the encoding may be a BS or a terminal. The encoding may include a CRC block segmentation, a CRC attachment, a polar encoding, and a rate matching. The polar encoding may include generating at least one of frozen bit or at least one parity bit, and a polar coding (i.e., multiplying with a generation matrix). Each operation may be defined as below.

Data or control streams from/to media access control (MAC) layer are encoded/decoded to offer transport and control services over the radio transmission link. Channel coding scheme is a combination of error detection, error correcting, rate matching, interleaving and transport channel or control information mapping onto/splitting from physical channels.

(1) Code Block Segmentation and Code Block CRC Attachment

An input bit sequence (i.e., control information) to the code block segmentation may be denoted by $a_0, a_1, a_2, a_3 \ldots, a_{A-1}$, where A>0. The input bit sequence may be segmented based on the number of code blocks and a length of the input bit sequence. For example, input bit sequence may be segmented the according to Table 5.

TABLE 5 if $I_{seg} = 1$
  Number of code blocks: C = 2;
else
  Number of code blocks: C = 1
end if
A'=[A/C]·C;
for i = 0 to A'−A−1
  $a'_i = 0$;
end for
for i = A'−A to A'−1
  $a'_i = a_{i-(A'-A)}$;
end for
s = 0;
for r = 0 to C−1
  for k = 0 to A'/C−1
    $c_{rk} = a'_s$;
    s = s + 1;
  end for
  The sequence $c_{r0}, c_{r1}, c_{r2}, c_{r3},\ldots, c_{r(A'/C-1)}$ is used to calculate the CRC parity bits $p_{r0}, p_{r1}, p_{r2},\ldots, p_{r(L-1)}$ with a generator polynomial of length L.
  for k = A'/C to A'/C+L−1
    $c_{rk} = p_{r(k-A'/C)}$;
  end for
end for In Table 5, a value of A is not larger than 1706.

For example, the generator polynomial for CRC may be one of generator polynomials in Table 6 below.

TABLE 6

| Length L | generator polynomial |
| --- | --- |
| 24 | $g_{CRC24A}(D) = [D^{24} + D^{23} + D^{18} + D^{17} + D^{14} + D^{11} + D^{10} + D^7 + D^6 + D^5 + D^4 + D^3 + D + 1]$ |

TABLE 6-continued

| Length L | generator polynomial |
|---|---|
| 24 | $g_{CRC24B}(D) = [D^{24} + D^{23} + D^6 + D^5 + D + 1]$ |
| 24 | $g_{CRC24C}(D) = [D^{24} + D^{23} + D^{21} + D^{20} + D^{17} + D^{15} + D^{13} + D^{12} + D^8 + D^4 + D^2 + D + 1]$ |
| 16 | $g_{CRC16}(D) = [D^{16} + D^{12} + D^5 + 1]$ |
| 11 | $g_{CRC11}(D) = [D^{11} + D^{10} + D^9 + D^5 + 1]$ |
| 6 | $g_{CRC6}(D) = [D^6 + D^5 + 1]$ |

After the Code block segmentation and code block CRC attachment, a bit sequence input for a given code block to channel coding is denoted by $c_0, c_1, c_2, c_3, \ldots, c_{K-1}$, where K is the number of bits to encode. After encoding the bits are denoted by $d_0, d_1, d_2, \ldots, d_{N-1}$, where $N=2^n$ and the value of n is determined based on a length of a rate matching output sequence and the number of bits to encode. For example, the value of n may be determined according to Table 7 below.

TABLE 7

If $E \le (9 / 8) \cdot 2^{(\lceil log_2 E \rceil - 1)}$ and $K / E < 9 / 16$
   $n_1 = \lceil log_2 E \rceil - 1$;
else
   $n_1 = \lceil log_2 E \rceil$;
end if
$R_{min} = 1 / 8$;
$n_2 = \lceil log_2(K / R_{min}) \rceil$;
$n = max\{min\{n_1, n_2, n_{max}\}, n_{min}\}$
where $n_{min} = 5$ .

In Table 7, E denotes the length of the rate matching output sequence. Herein, UE is not expected to be configured with $K+n_{PC}>E$, where $n_{PC}$ is the number of PC bits.

(2) Polar Coding (2-a) Interleaving

The bit sequence is interleaved based on a predefined interleaving pattern. In an embodiment, the interleaving may be performed for downlink information and not performed for uplink information. The bit sequence $c_0, c_1, c_2, c_3, \ldots, c_{K-1}$ is interleaved into a bit sequence $c'_0, c'_1, c'_2, c'_3, \ldots, c'_{K-1}$ according to the Table 8 below.

TABLE 8

$c'_k = c_{\Pi(k)}, k = 0,1,\ldots, K - 1$
where the interleaving pattern $\Pi(k)$ is given by the following:
  if $I_{IL} = 0$
    $\Pi(k) = k$ , $k = 0,1,\ldots,K - 1$
  else
    $k = 0$ ;
    for m = 0 to $K_{IL}^{max} - 1$
      if $\Pi_{IL}^{max}(m) \ge K_{IL}^{max} - K$
        $\Pi(k) = \Pi_{IL}^{max}(m) - (K_{IL}^{max} - K)$;
        $k = k + 1$;
      end if
    end for
  end if In Table 8, $I_{IL}$ denotes a variable indicating whether to perform the interleaving. In an embodiment, the $I_{IL}$ may be set to 0 if the bit sequence $c'_0, c'_1, c'_2, c'_3, \ldots, C_{K-1}$ includes the uplink information. The $\Pi_{IL}^{max}(m)$ is given by Table 9 and $K_{IL}^{max} = 164$

TABLE 9

| m | $\Pi_{IL}^{max}(m)$ |
|---|---|
| 0 | 0 |
| 1 | 2 |
| 2 | 4 |
| 3 | 7 |
| 4 | 9 |
| 5 | 14 |
| 6 | 19 |
| 7 | 20 |
| 8 | 24 |
| 9 | 25 |
| 10 | 26 |
| 11 | 28 |
| 12 | 31 |
| 13 | 34 |
| 14 | 42 |
| 15 | 45 |
| 16 | 49 |
| 17 | 50 |
| 18 | 51 |
| 19 | 53 |
| 20 | 54 |
| 21 | 56 |
| 22 | 58 |
| 23 | 59 |
| 24 | 61 |
| 25 | 62 |
| 26 | 65 |
| 27 | 66 |
| 28 | 67 |
| 29 | 69 |
| 30 | 70 |
| 31 | 71 |
| 32 | 72 |
| 33 | 76 |
| 34 | 77 |
| 35 | 81 |
| 36 | 82 |
| 37 | 83 |
| 38 | 87 |
| 39 | 88 |
| 40 | 89 |
| 41 | 91 |
| 42 | 93 |
| 43 | 95 |
| 44 | 98 |
| 45 | 101 |
| 46 | 104 |
| 47 | 106 |
| 48 | 108 |
| 49 | 110 |
| 50 | 111 |
| 51 | 113 |
| 52 | 115 |
| 53 | 118 |
| 54 | 119 |
| 55 | 120 |
| 56 | 122 |
| 57 | 123 |
| 58 | 126 |
| 59 | 127 |
| 60 | 129 |
| 61 | 132 |
| 62 | 134 |
| 63 | 138 |
| 64 | 139 |
| 65 | 140 |
| 66 | 1 |
| 67 | 3 |
| 68 | 5 |
| 69 | 8 |
| 70 | 10 |
| 71 | 15 |
| 72 | 21 |
| 73 | 27 |
| 74 | 29 |
| 75 | 32 |
| 76 | 35 |
| 77 | 43 |

TABLE 9-continued

| m | $\Pi_{IL}^{max}$ (m) |
|---|---|
| 78 | 46 |
| 79 | 52 |
| 80 | 55 |
| 81 | 57 |
| 82 | 60 |
| 83 | 63 |
| 84 | 68 |
| 85 | 73 |
| 86 | 78 |
| 87 | 84 |
| 88 | 90 |
| 89 | 92 |
| 90 | 94 |
| 91 | 96 |
| 92 | 99 |
| 93 | 102 |
| 94 | 105 |
| 95 | 107 |
| 96 | 109 |
| 97 | 112 |
| 98 | 114 |
| 99 | 116 |
| 100 | 121 |
| 101 | 124 |
| 102 | 128 |
| 103 | 130 |
| 104 | 133 |
| 105 | 135 |
| 106 | 141 |
| 107 | 6 |
| 108 | 11 |
| 109 | 16 |
| 110 | 22 |
| 111 | 30 |
| 112 | 33 |
| 113 | 36 |
| 114 | 44 |
| 115 | 47 |
| 116 | 64 |
| 117 | 74 |
| 118 | 79 |
| 119 | 85 |
| 120 | 97 |
| 121 | 100 |
| 122 | 103 |
| 123 | 117 |
| 124 | 125 |
| 125 | 131 |
| 126 | 136 |
| 127 | 142 |
| 128 | 12 |
| 129 | 17 |
| 130 | 23 |
| 131 | 37 |
| 132 | 48 |
| 133 | 75 |
| 134 | 80 |
| 135 | 86 |
| 136 | 137 |
| 137 | 143 |
| 138 | 13 |
| 139 | 18 |
| 140 | 38 |
| 141 | 144 |
| 142 | 39 |
| 143 | 145 |
| 144 | 40 |
| 145 | 146 |
| 146 | 41 |
| 147 | 147 |
| 148 | 148 |
| 149 | 149 |
| 150 | 150 |
| 151 | 151 |
| 152 | 152 |
| 153 | 153 |
| 154 | 154 |
| 155 | 155 |
| 156 | 156 |
| 157 | 157 |
| 158 | 158 |
| 159 | 159 |
| 160 | 160 |
| 161 | 161 |
| 162 | 162 |
| 163 | 163 |

(2-b) Polar Encoding

The Polar sequence $Q_0^{N_{max}-1} = \{Q_0^{N_{max}}, Q_1^{N_{max}}, \ldots, Q_{N_{max}-1}^{N_{max}}\}$ is given by Table 10, where $0 \leq Q_I^{N_{max}} \leq N_{max}-1$ denotes a bit index before Polar encoding for I=0, 1, ..., $N_{max}-1$ and $N_{max}=1024$. Polar sequence $Q_0^{N_{max}-1}$ and its corresponding reliability $W(Q_i^{N_{max}})$ may be defined as Table 10 below.

TABLE 10

| $W(Q_i^{N_{max}})$ | $Q_i^{N_{max}}$ |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |

TABLE 10-continued

| W ($Q_i^{Nmax}$) | $Q_i^{Nmax}$ |
|---|---|
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |

TABLE 10-continued

| W ($Q_i^{Nmax}$) | $Q_i^{Nmax}$ |
|---|---|
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |

TABLE 10-continued

| W ($Q_i^{Nmax}$) | $Q_i^{Nmax}$ |
|---|---|
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |

TABLE 10-continued

| W ($Q_i^{Nmax}$) | $Q_i^{Nmax}$ |
|---|---|
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |

TABLE 10-continued

| W ($Q_i^{Nmax}$) | $Q_i^{Nmax}$ |
|---|---|
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |

TABLE 10-continued

| W ($Q_i^{Nmax}$) | $Q_i^{Nmax}$ |
|---|---|
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |

TABLE 10-continued

| W ($Q_i^{Nmax}$) | $Q_i^{Nmax}$ |
|---|---|
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |

TABLE 10-continued

| W ($Q_i^{Nmax}$) | $Q_i^{Nmax}$ |
|---|---|
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

The Polar sequence $Q_0^{Nmax-1}$ is in ascending order of reliability $W(Q_0^{Nmax}) < W(Q_1^{Nmax}) < \ldots < W(Q_{Nmax-1}^{Nmax})$, where $W(Q_1^{Nmax})$ denotes the reliability of bit index $Q_1^{Nmax}$.

For any code block encoded to N bits, a same Polar sequence $Q_0^{N-1} = \{Q_0^N, Q_1^N, Q_2^N, \ldots, Q_{N-1}^N\}$ is used. The Polar sequence Q is a subset of Polar sequence $Q_0^{Nmax-1}$ with all elements $Q_i^{Nmax}$ of values less than N, ordered in ascending order of reliability $W(Q_0^N) < W(Q_1^N), W(Q_2^N) < \ldots < W(Q_{N-1}^N)$.

Denote $\overline{Q}_I^N$ as a set of bit indices in Polar sequence $Q_0^{N-1}$, and $\overline{Q}_F^N$ as the set of other bit indices in polar sequence $Q_0^{N-1}$, where $\overline{Q}_I^N$ and $\overline{Q}_F^N$ are given in (3-a) Sub-block interleaving. $|\overline{Q}_I^N| = K + n_{PC}$, $|\overline{Q}_F^N| = N - |\overline{Q}_I^N|$, and $n_{PC}$ is the number of PC bits.

Denote $G_N = (G_2)^{\otimes n}$ as the n-th Kronecker power of matrix $G_2$, where $$G_2 = \begin{bmatrix} 1 & 0 \\ 1 & 1 \end{bmatrix}.$$

For a bit index j with j=0, 1, ... N, denote $g_j$ as the j-th row of $G_N$ and $w(g_j)$ as the row weight of $g_j$, where $w(g_j)$ is the number of ones in $g_j$. Denote the set of bit indices for PC bits as $Q_P^{CN}$, where $|Q_{PC}^N| = n_{PC}$. A number of $(n_{PC} - n_{PC}^{wm})$ PC bits are placed in the $(n_{PC} - n_{PC}^{wm})$ least reliable bit indices in $\overline{Q}_1^N$. A number of $n_{PC}^{wm}$ other PC bits are placed in the bit indices of minimum row weight in $\tilde{Q}_1^N$, where $\tilde{Q}_1^N$ denotes the $(|\overline{Q}_1^N| - n_{PC})$ most reliable bit indices in $\overline{Q}_1^N$; if there are more than $n_{PC}$ bit indices of the same minimum row weight in $\tilde{Q}_1^N$, the $n_{PC}^{wm}$ other PC bits are placed in the $n_{PC}^{wm}$ bit indices of the highest reliability and the minimum row weight in $\tilde{Q}_1^N$.

The bit sequence $c'_0, c'_1, c'_2, c'_3, \ldots, c'_{K-1}$ is embedded into a bit sequence $u = [u_0 \, u_1 \, u_2 \, \ldots \, u_{N-1}]$. The bit sequence $u = [u_0 \, u_1 u_2 \ldots u_{N-1}]$ includes at least one frozen bit or at least one parity bit. The at least one parity bit is determined based on the bit sequence $c'_0, c'_1, c'_2, c'_3, \ldots, c'_{K-1}$. For example, the $u = [u_0 \, u_1 u_2 \, u_{N-1}]$ is generated according to Table 11 below.

TABLE 11

```
k = 0;
if n_PC > 0
    y_0 = 0; y_1 = 0; y_2 = 0; y_3 = 0; y_4 = 0;
    for n = 0 to N − 1
        y_t = y_0 ; y_0 = y_1 ; y_1 = y_2 ; y_2 = y_3 ; y_3 = y_4 ; y_4 = y_t ;
        if n ∈ Q̄_I^N
            if n ∈ Q_PC^N
                u_n = y_0 ;
            else
                u_n = c_k' ;
                k = k + 1;
                y_0 = y_0 ⊕ u_n ;
            end if
        else
            u_n = 0;
        end if
    end for
else
    for n = 0 to N − 1
        if n ∈ Q̄_I^N
            u_n = c_k';
            k = k + 1;
        else
            u_n = 0;
        end if
    end for
end if
```

The output after encoding $d = [d_0 \, d_1 \, d_2 \ldots d_{N-1}]$ is obtained by $d = uG_N$. The encoding is performed in galois fields (2) (GF(2)).

(3) Rate Matching

The rate matching for Polar code is defined per coded block and consists of sub-block interleaving, bit collection, and bit interleaving. An input bit sequence to rate matching is $d_0, d_1, d_2, \ldots, d_{N-1}$. The output bit sequence after rate matching is denoted as $f_0, f_1, f_2, \ldots, f_{E-1}$.

(3-a) Sub-Block Interleaving

The bits input to the sub-block interleaver are the coded bits $d_0, d_1, d_2, \ldots, d_{N-1}$. The coded bits $d_0, d_1, d_2, \ldots, d_{N-1}$ are divided into 32 sub-blocks. The sub-block interleaving is performed based on a predefined sub-block interleaver pattern. For example, the bits output from the sub-block interleaver are denoted as $y_0, y_1, y_2, \ldots, y_{N-1}$, generated according to Table 12 below.

TABLE 12

```
for n = 0 to N − 1
    i = ⌊32n/N⌋;
    J(n) = P(i) × (N/32) + mod(n, N/32);
    y_n = d_{J(n)};
end for
```

In Table 12, P(i) denotes the sub-block interleaver pattern. In an embodiment, the sub-block interleaver pattern may be defined as Table 13 below.

TABLE 13

| i | P(i) |
|---|---|
| 0 | 0 |
| 1 | 1 |
| 2 | 2 |
| 3 | 4 |
| 4 | 3 |
| 5 | 5 |
| 6 | 6 |
| 7 | 7 |
| 8 | 8 |
| 9 | 16 |
| 10 | 9 |
| 11 | 17 |
| 12 | 10 |
| 13 | 18 |
| 14 | 11 |
| 15 | 19 |
| 16 | 12 |
| 17 | 20 |
| 18 | 13 |
| 19 | 21 |
| 20 | 14 |
| 21 | 22 |
| 22 | 15 |
| 23 | 23 |
| 24 | 24 |
| 25 | 25 |
| 26 | 26 |
| 27 | 28 |
| 28 | 27 |
| 29 | 29 |
| 30 | 30 |
| 31 | 31 |

The sets of bit indices $\overline{Q}_I^N$ and $\overline{Q}_F^N$ are determined according to Table 14 below.

TABLE 14

```
Q̄_{F,tmp}^N = ∅
if E < N
    if K/E ≤ 7/16    -- puncturing
        for n = 0 to N - E - 1
            Q̄_{F,tmp}^N = Q̄_{F,tmp}^N ∪ {J(n)};
        end for
        if E ≥ 3N/4
            Q̄_{F,tmp}^N = Q̄_{F,tmp}^N ∪ {0,1,...,⌈3N/4 - E/2⌉ - 1};
        else
            Q̄_{F,tmp}^N = Q̄_{F,tmp}^N ∪ {0,1,...,⌈9N/16 - E/4⌉ - 1};
        end if
    else    -- shortening
        for n = E to N - 1
            Q̄_{F,tmp}^N = Q̄_{F,tmp}^N ∪ {J(n)};
        end for
    end if
end if
Q̄_{I,tmp}^N = Q_0^{N-1} \ Q̄_{F,tmp}^N;
Q̄_I^N comprises (K + n_{PC}) most reliable bit indices in Q̄_{I,tmp}^N;
Q̄_F^N = Q_0^{N-1} \ Q̄_I^N;
```

In Table 14, $K$, $n_{PC}$, and $Q_0^{N-1}$ are defined in (2) Polar coding.

(3-b) Bit Selection

The Bit selection may be performed by using a circular buffer. The bit sequence after the sub-block interleaver $y_0, y_1, y_2, \ldots, y_{N-1}$ is written into the circular buffer of length N.

Denoting by E the rate matching output sequence length, a bit selection output bit sequence $e_k$, k=0, 1, 2, . . . , E−1, may be generated by repetitions, puncturing or shortening. For example, the bit selection output bit sequence may be generated according to Table 15 below.

TABLE 15

```
if E ≥ N    -- repetition
    for k = 0 to E - 1
        e_k = y_{mod(k,N)};
    end for
else
    if K/E ≤ 7/16    -- puncturing
        for k = 0 to E - 1
            e_k = y_{k+N-E};
        end for
    else    -- shortening
        for k = 0 to E - 1
            e_k = y_k;
        end for
    end if
end if
```

(3-c) Interleaving of Coded Bits

The bit sequence $e_0, e_1, e_2, \ldots, e_{E-1}$ is interleaved into a bit sequence $f_0, f_1, f_2, \ldots, f_{E-1}$. The coded bits are interleaved based on a length of bit sequence $e_0, e_1, e_2, \ldots, e_{E-1}$. In an embodiment, the interleaving may be performed for uplink information and not performed for downlink information. For example, the bit sequence $e_0, e_1, e_2, \ldots, e_{E-1}$ is interleaved into a bit sequence $f_0, f_1, f_2, \ldots, f_{E-1}$ according to Table 16 below.

TABLE 16

```
If I_{BIL} = 1
    Denote T as the smallest integer such that T (T + 1)/2 ≥ E ;
    k = 0 ;
    for i = 0 to T - 1
        for j = 0 to T - 1 - i
            if k < E
                v_{i,j} = e_k ;
            else
                v_{i,j} =< NULL >;
            end if
            k = k + 1;
        end for
    end for
    k = 0 ;
    for j = 0 to T - 1
        for i = 0 to T - 1 - j
            if v_{i,j} ≠< NULL >
                f_k = v_{i,j};
                k = k + 1
            end if
        end for
    end for
else
    for i = 0 to E - 1
        f_i = e_i;
    end for
end if
```

In Table 16, $I_{BIL}$ denotes a variable indicating whether to perform the interleaving of coded bits. In an embodiment, the $I_{BIL}$ may be set to 0 if the bit sequence $e_0, e_1, e_2, \ldots, e_{E-1}$ includes the downlink information. The value of E is not larger than 8192.

The above operations may be performed by a device described in FIG. 4. For example, the outer coder 402 may further perform at least one of operations in (1) Code block segmentation and code block CRC attachment, the encoding input sequence mapper 404 and the polar code encoder 406 may further perform at least one of operation in (2) Polar coding, and the rate matcher 408 may further perform at least one of operation in (3) Rate matching.

An apparatus and a method according to various embodiments of the disclosure can define encoding and decoding of all parameters when a polar code using a concatenated outer code is configured.

An apparatus and a method according to various embodiments of the disclosure can adaptively change a parameter in which encoding and decoding are not defined when a polar code transmitter and a polar code receiver using a concatenated outer code operate.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in nonvolatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a first device in a wireless communication system, the method comprising:
obtaining a first bit sequence by using an input bit sequence for uplink control information (UCI) and at least one cyclic redundancy check (CRC) bit;
obtaining an output of a polar coding by using the first bit sequence, at least one frozen bit, and at least one parity check (PC) bit, wherein:
the at least one frozen bit is set as zero, and
a number of bits of the at least one PC bit is determined as three in a case that a number of bits of the first bit sequence is within a predetermined range;
obtaining an output sequence of a rate matching by performing the rate matching for the output of the polar coding; and
transmitting, to a second device, a signal using the output bit sequence of the rate matching,
wherein reliabilities of bit indices of the first bit sequence and the at least one PC bit are higher than reliabilities of bit indices of the at least one frozen bit, and
wherein the polar coding is performed based on a condition that a length of the output bit sequence of the rate matching is equal to or greater than a sum of a length of the first bit sequence and a number of the at least one PC bit.

2. The method of claim 1,
wherein the obtaining of the output of the polar coding comprises:
obtaining a second bit sequence by using the first bit sequence, the at least one frozen bit, and the at least one PC bit, and
obtaining the output of the polar coding by multiplying the second bit sequence and a generation matrix for a polar encoding.

3. The method of claim 2, wherein the obtaining of the output bit sequence of the rate matching comprises:
obtaining a third bit sequence by interleaving the output of the polar coding in units of sub-blocks;
writing the third bit sequence in a circular buffer; and
extracting bits corresponding to the length of the output bit sequence of the rate matching from the circular buffer.

4. The method of claim 2,
wherein the generation matrix is determined based on at least one Kronecker power of $$F = \begin{bmatrix} 1 & 0 \\ 1 & 1 \end{bmatrix}.$$

wherein a length of the second bit sequence corresponds to a value of a power of 2 which is determined according to the length of the first bit sequence, and
wherein a length of the output of the polar coding corresponds to the value of the power of 2.

5. The method of claim 1,
wherein bits of the output of the polar coding are arranged based on reliabilities of bit indices that are predefined.

6. The method of claim 1, further comprising:
determining whether the condition is satisfied or not; and
in case that the condition is not satisfied, suspending transmission or changing the input bit sequence to satisfy the condition.

7. The method of claim 1,
wherein the at least one frozen bit is obtained based on a length of the output of the polar coding and the length of the output sequence of the rate matching.

8. A method performed by a second device in a wireless communication system, the method comprising:
receiving, from a first device, a signal using an output bit sequence of a rate matching applied to an output of a polar coding; and
obtaining an input bit sequence for uplink control information (UCI) from the signal, wherein the output of the polar coding is associated with at least one of a first bit sequence, at least one frozen bit, or at least one parity check (PC) bit, wherein the first bit sequence is associated with the input bit sequence and at least one cyclic redundancy check (CRC) bit, wherein the at least one frozen bit is set as zero, wherein a number of bits of the at least one PC bit is determined as three in a case that a number bits of the first bit sequence is within a predetermined range, wherein reliabilities of bit indices of the first bit sequence and the at least one PC bit are higher than reliabilities of bit indices of the at least one frozen bit, and wherein the polar coding is performed based on a condition that a length of the output bit sequence of the rate matching is equal to or greater than a sum of a length of the first bit sequence and a number of the at least one PC bit.

9. The method of claim 8, wherein bits of the output of the polar coding are arranged based on reliabilities of bit indices that are predefined.

10. The method of claim 8, wherein the at least one frozen bit is obtained based on a length of the output of the polar coding and the length of the output sequence of the rate matching.

11. A first device in a wireless communication system, the first device comprising:

at least one transceiver; and at least one processor coupled to the transceiver and configured to:

obtain a first bit sequence by using an input bit sequence uplink control information (UCI) and at least one cyclic redundancy check (CRC) bit, obtain an output of a polar coding by using at least one of the first bit sequence, at least one frozen bit, or at least one parity check (PC) bit, wherein:

the at least one frozen bit is set as zero, and a number of bits of the at least one PC bit is determined as three in a case that a number bits of the first bit sequence is within a predetermined range, obtaining an output sequence of a rate matching by performing the rate matching for the output of the polar coding, and transmit, to a second device, a signal using the output bit sequence of the rate matching, wherein reliabilities of bit indices of the first bit sequence and the at least one PC bit are higher than reliabilities of bit indices of the at least one frozen bit, and wherein the polar coding is performed based on a condition that a length of the output bit sequence of the rate matching is equal to or greater than a sum of a length of the first bit sequence, a number of the at least one CRC bit and a number of the at least one PC bit.

12. The first device of claim 11, wherein the at least one processor is, to obtain the output of the polar coding, configured to:

obtain a second bit sequence by using the first bit sequence, the at least one frozen bit, and the at least one PC bit, and obtain the output of the polar coding by multiplying the second bit sequence and a generation matrix for a polar encoding.

13. The first device of claim 12, wherein the at least one processor is, to obtain the output of the polar coding, configured to:

obtain a third bit sequence by interleaving the output of the polar coding in units of sub-blocks, writing the third bit sequence in a circular buffer, and extracting bits corresponding to the length of the output bit sequence of the rate matching from the circular buffer.

14. The first device of claim 12, wherein the generation matrix is determined based on at least one Kronecker power of $$F = \begin{bmatrix} 1 & 0 \\ 1 & 1 \end{bmatrix}.$$

wherein a length of the second bit sequence corresponds to a value of a power of 2 which is determined according to the length of the first bit sequence, and wherein a length of the output of the polar coding corresponds to the value of the power of 2.

15. The first device of claim 11, wherein bits of the output of the polar coding are arranged based on reliabilities of bit indices that are predefined.

16. The first device of claim 11, wherein the at least one processor is further configured to:

determine whether the condition is satisfied or not, and in case that the condition is not satisfied, suspend transmission or change the input bit sequence to satisfy the condition.

17. The first device of claim 11, wherein the at least one frozen bit is obtained based on a length of the output of the polar coding and the length of the output sequence of the rate matching.

* * * * *

UNITED STATES PATENT AND TRADEMARK OFFICE
CERTIFICATE OF CORRECTION

PATENT NO. : 11,095,397 B2
APPLICATION NO. : 16/370059
DATED : August 17, 2021
INVENTOR(S) : Jang et al.

It is certified that error appears in the above-identified patent and that said Letters Patent is hereby corrected as shown below:

In the Claims

1. Claim 11, Column 55, Line 42, "obtaining" should read -- obtain --

2. Claim 13, Column 56, Line 19, "writing" should read -- write --

3. Claim 13, Column 56, Line 20, "extracting" should read -- extract --

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*